United States Patent
Yamazaki et al.

[11] Patent Number: 6,059,922
[45] Date of Patent: May 9, 2000

[54] PLASMA PROCESSING APPARATUS AND A PLASMA PROCESSING METHOD

[75] Inventors: Osamu Yamazaki, Yokohama; Shigeyuki Takagi, Fujisawa; Kaoru Taki; Noboru Okamoto, both of Yokohama; Yutaka Uchida, Kamakura; Naoki Tajima, Zushi; Masashi Yamage, Yokohama, all of Japan

[73] Assignee: Kabushiki Kaisha Toshiba, Kawasaki, Japan

[21] Appl. No.: 08/966,243

[22] Filed: Nov. 7, 1997

[30] Foreign Application Priority Data

Nov. 8, 1996 [JP] Japan .................................. 8-296727
Mar. 13, 1997 [JP] Japan .................................. 9-058677

[51] Int. Cl.$^7$ ...................................................... H05H 1/00
[52] U.S. Cl. .................................. 156/345; 118/723 MW; 118/723 ME
[58] Field of Search .................. 156/345; 118/723 MW, 118/723 ME, 723 MR, 723 MA; 204/298.38

[56] References Cited

U.S. PATENT DOCUMENTS 5,262,610 11/1993 Huang et al. ........................... 156/345
5,368,685 11/1994 Kumihashi et al. .................... 156/345

FOREIGN PATENT DOCUMENTS 5-3732   1/1993   Japan .
5-3736   1/1993   Japan .
8-274065 10/1996  Japan .

Primary Examiner—Thi Dang
Attorney, Agent, or Firm—Oblon, Spivak, McClelland, Maier & Neustadt, P.C.

[57] ABSTRACT

A plasma processing apparatus according to the present invention includes a microwave guide for introducing a microwave, an air-tight chamber for internally setting an object to be processed, for generating a plasma by introducing the microwave introduced by the microwave guide and by supplying a reaction gas, and for processing the object by an active species generated by the plasma, a dielectric window provided between the microwave guide and the air-tight chamber, for enclosing the air-tight chamber, a top plate provided with a microwave guide port arranged with a gap maintained from the dielectric window, and cooling means provided for the top plate, for cooling heat caused by generation of the plasma, e.g., a cooling means for causing a cooling gas to flow in the gap between the dielectric window and the top plate.

25 Claims, 17 Drawing Sheets

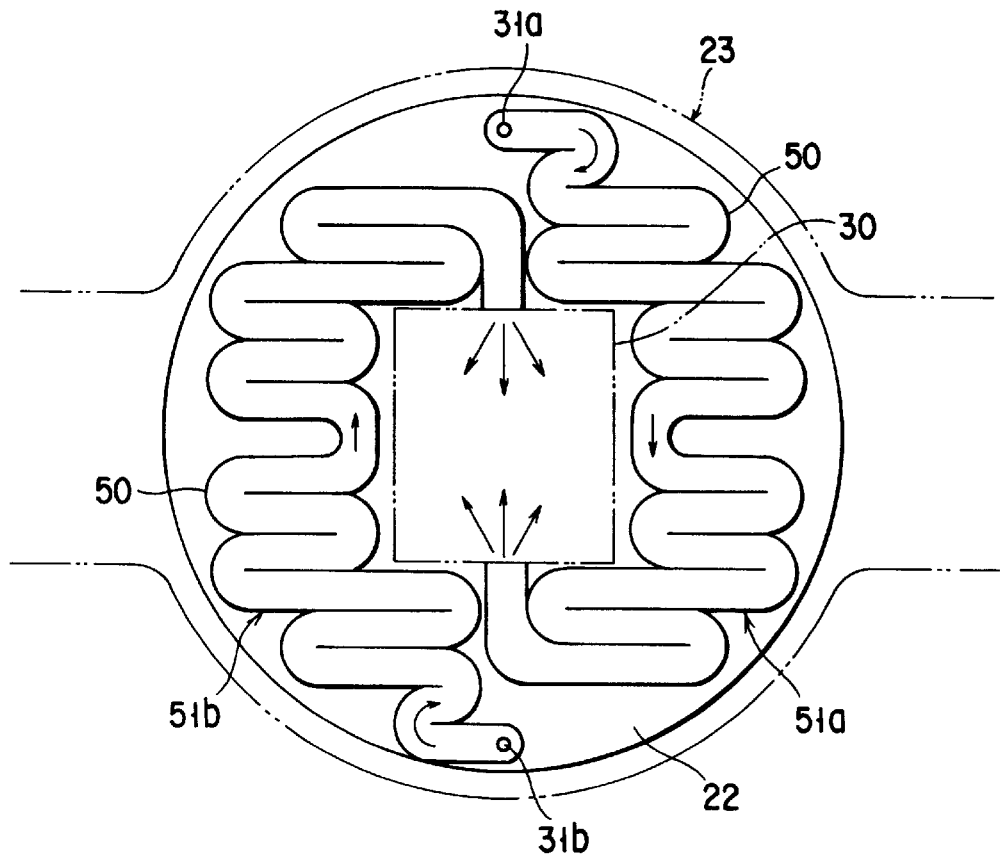
F I G. 5
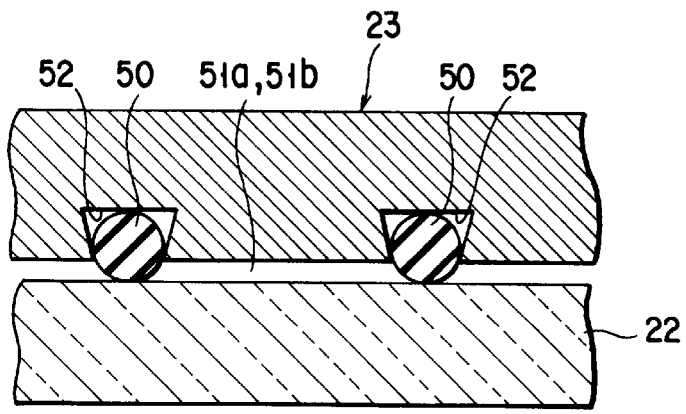
F I G. 6

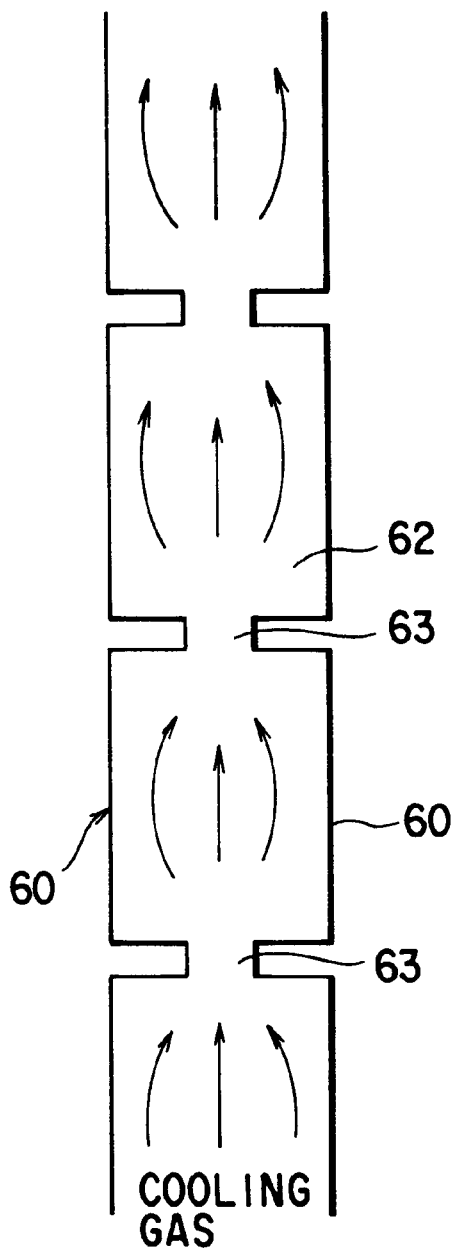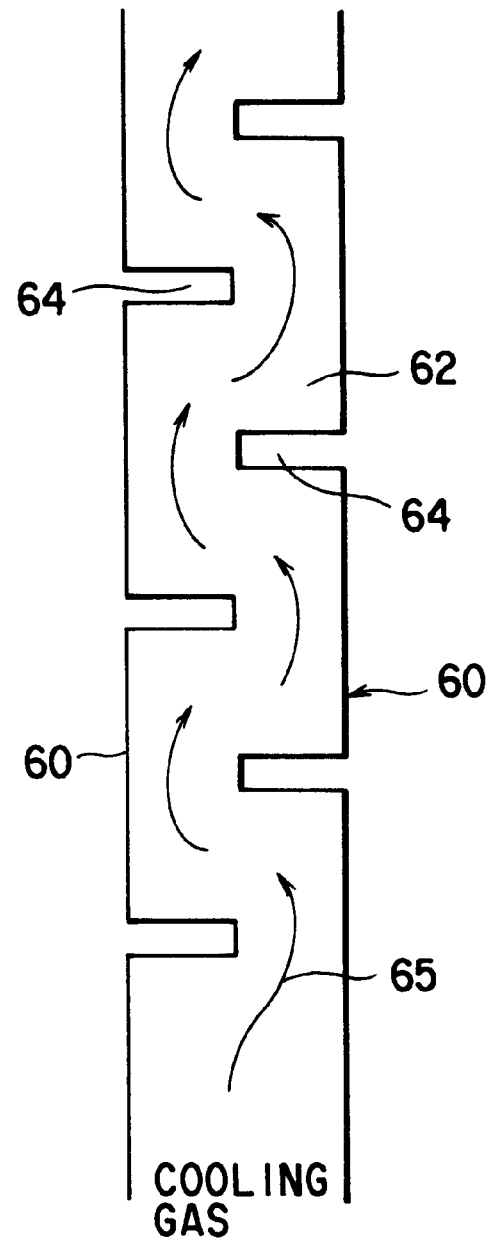
F I G. 9  F I G. 10

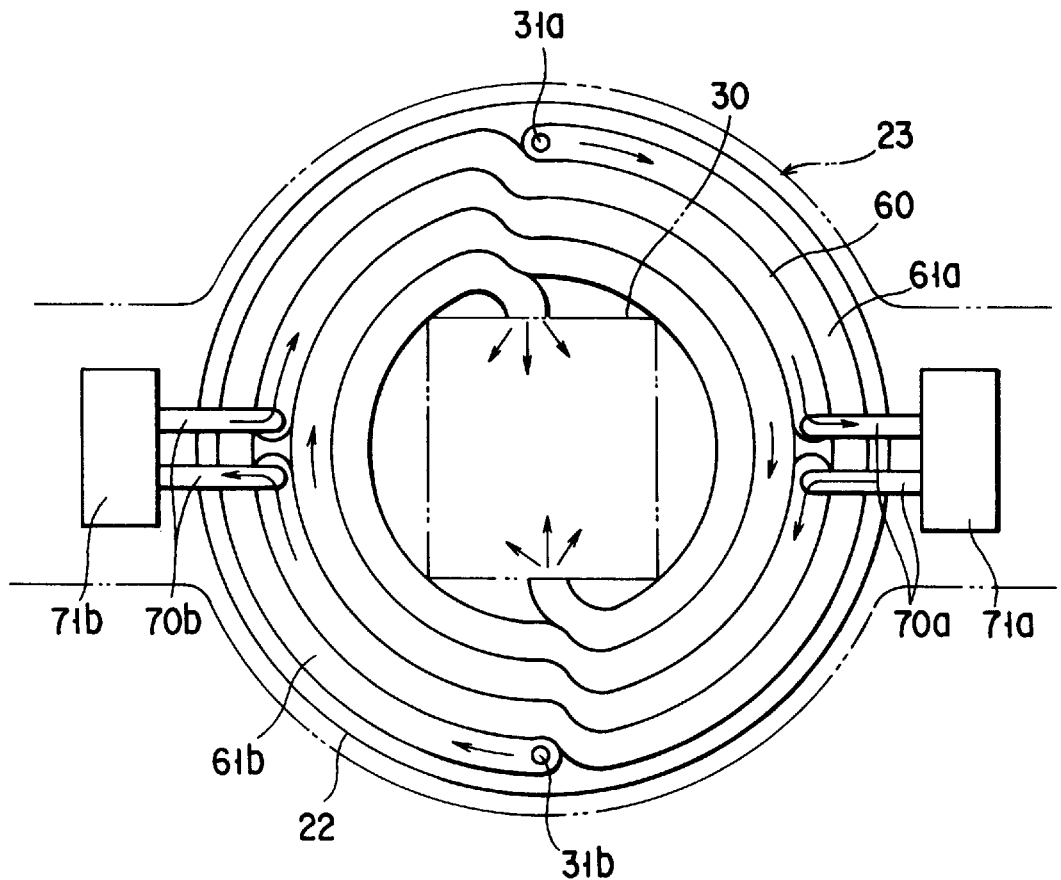
F I G. 11
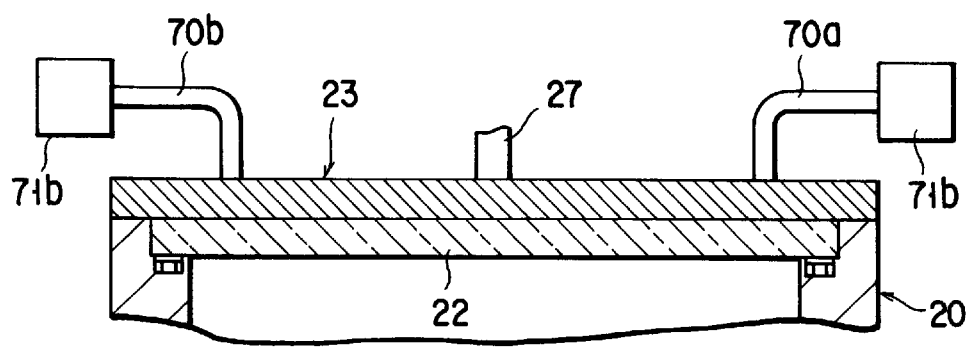
F I G. 12

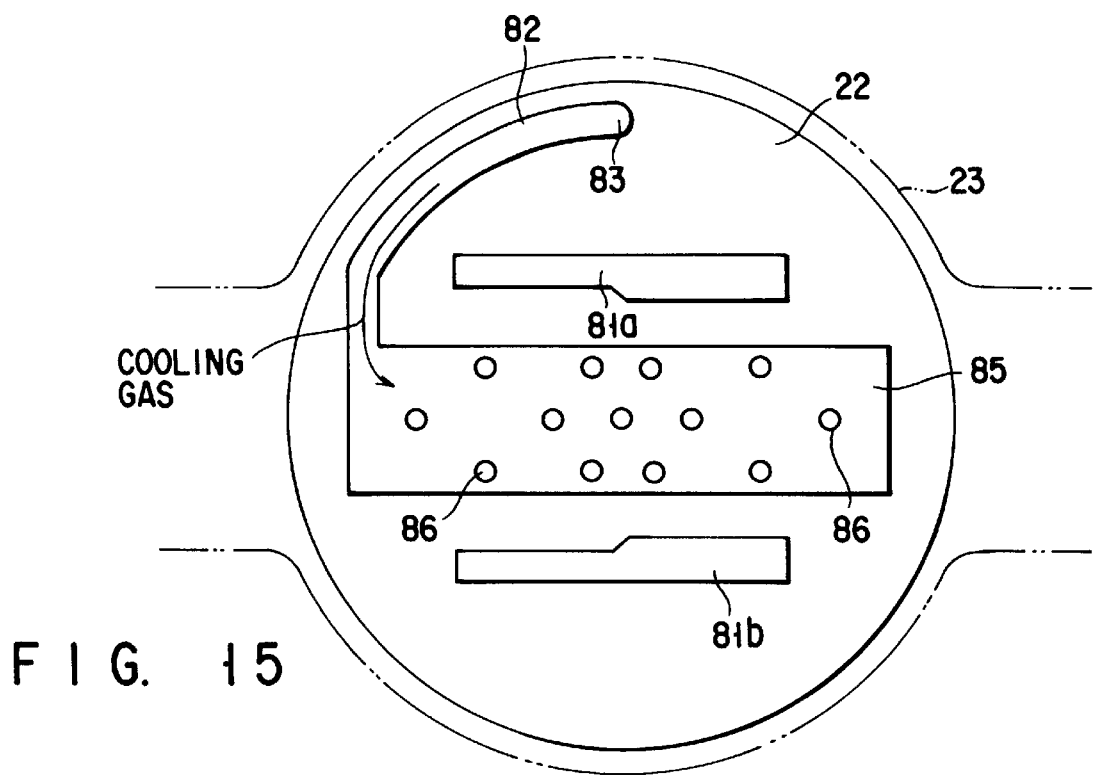
F I G. 15
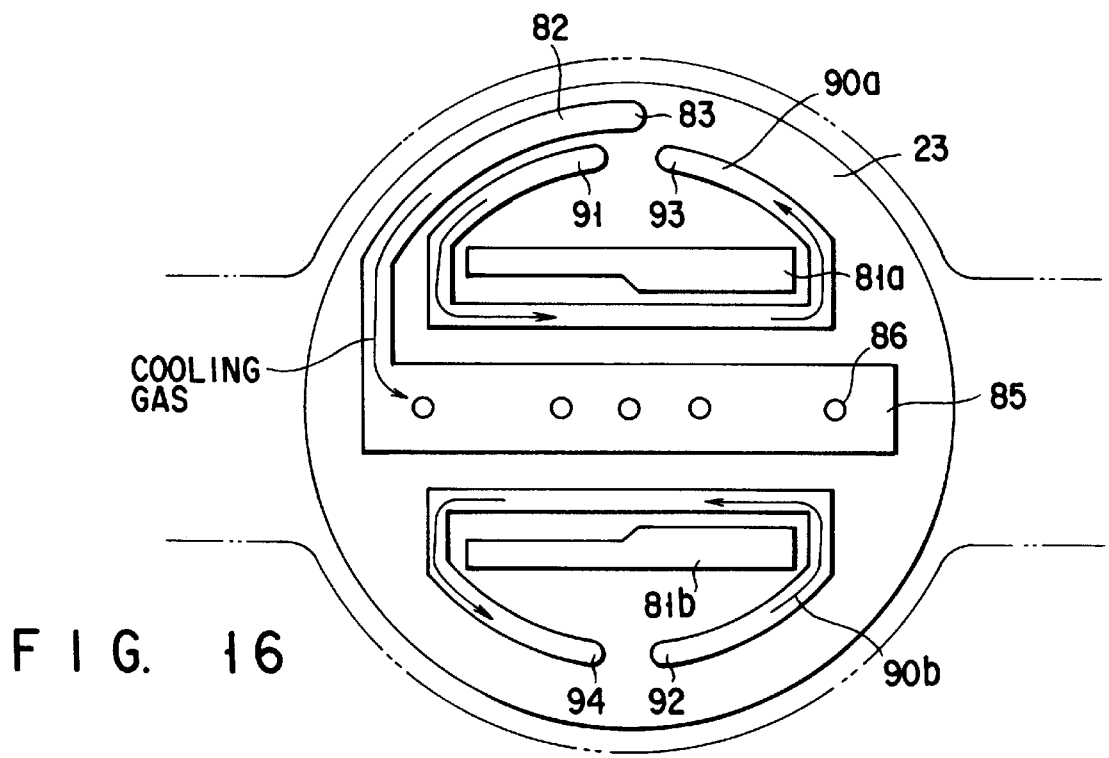
F I G. 16

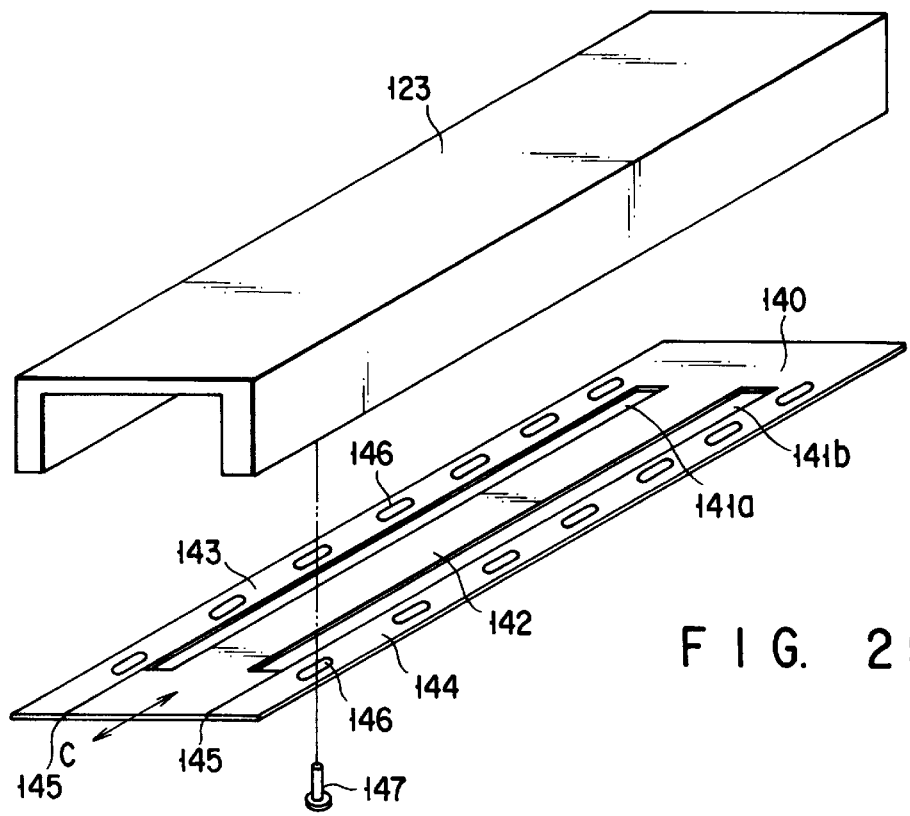
F I G. 25
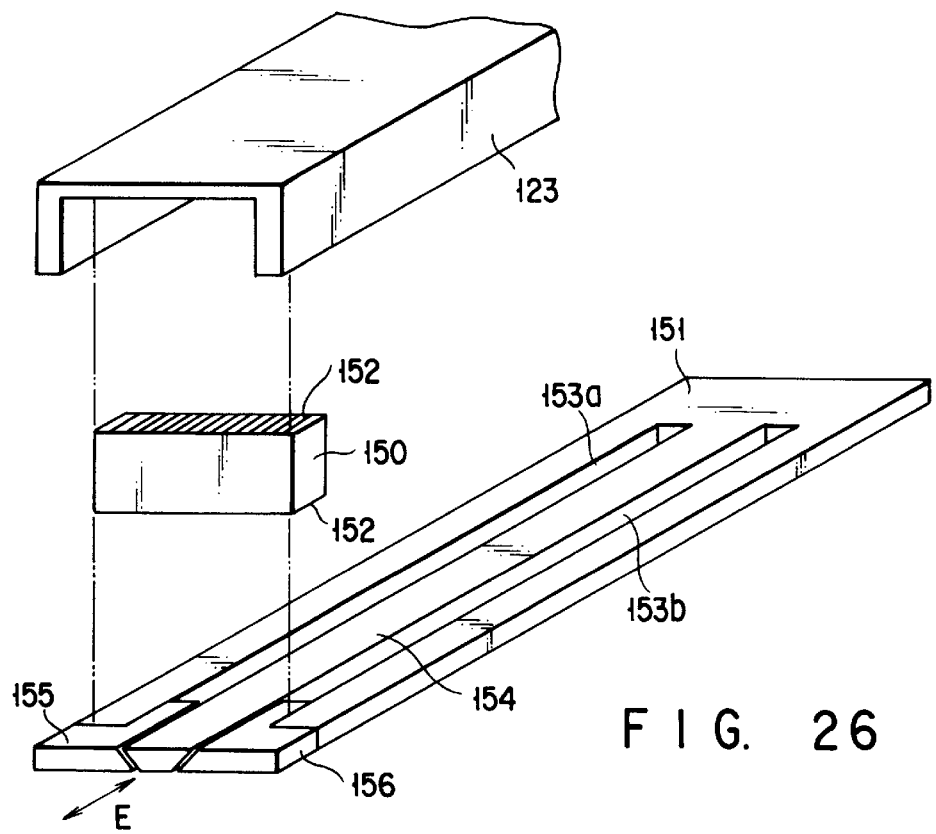
F I G. 26

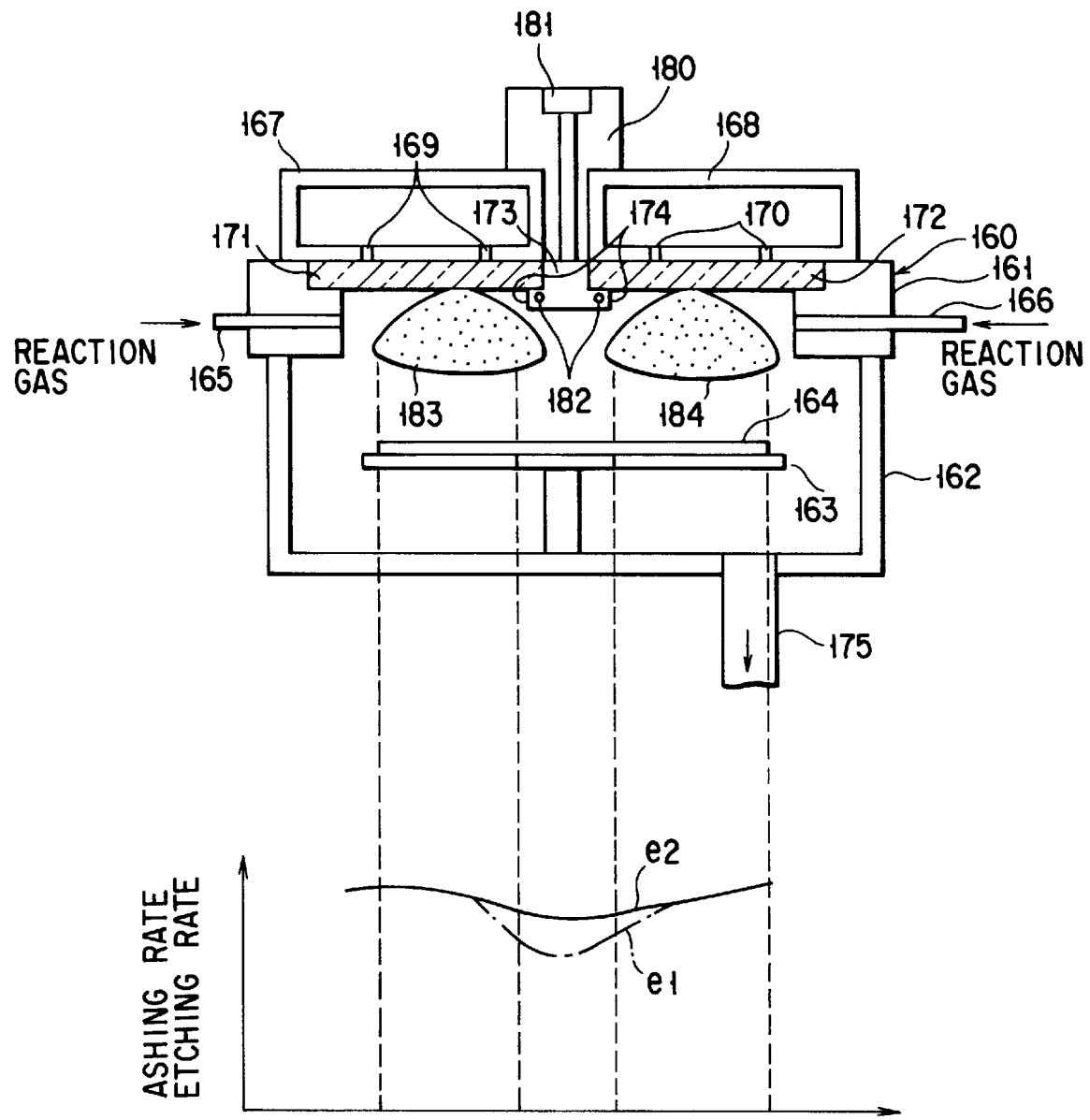
F I G. 27

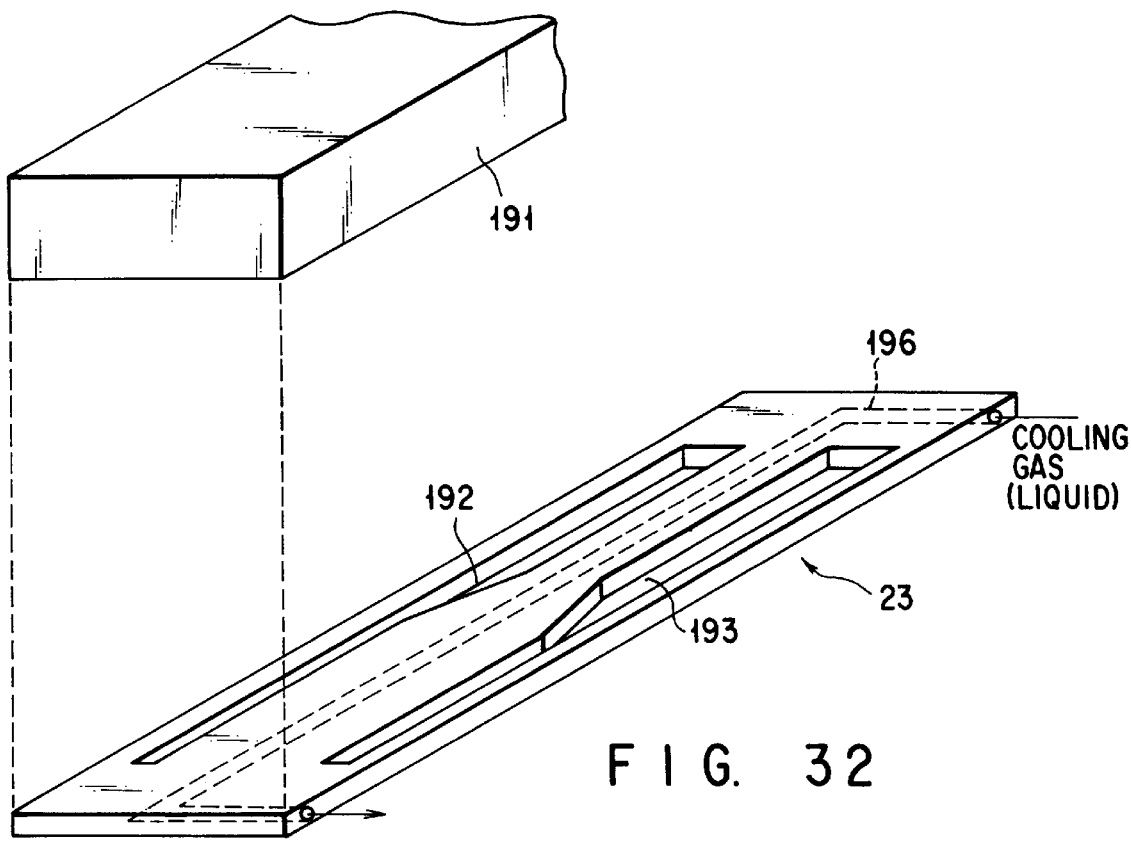
F I G. 32
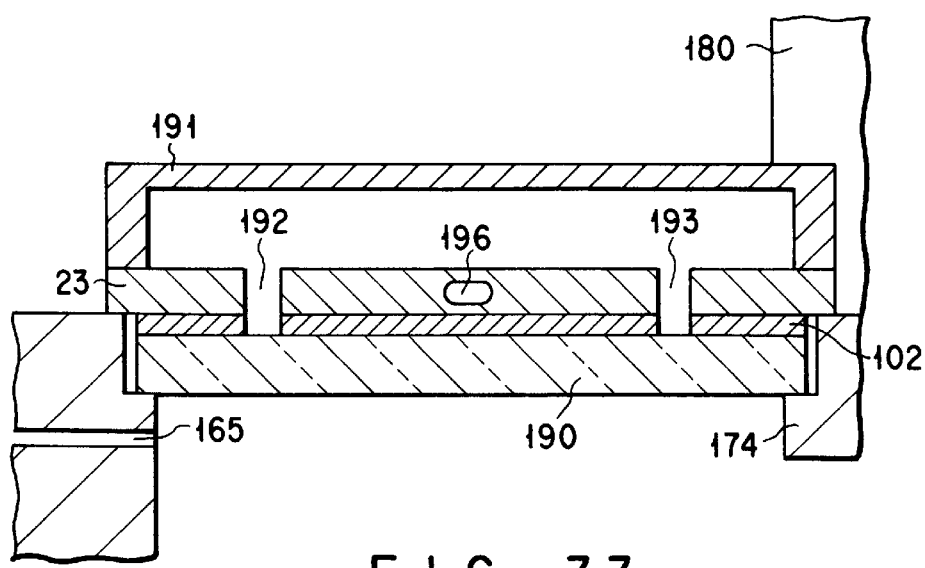
F I G. 33

PLASMA PROCESSING APPARATUS AND A PLASMA PROCESSING METHOD

BACKGROUND OF THE INVENTION

The present invention relates to a plasma processing apparatus used for etching or ashing when manufacturing a semiconductor device, a liquid crystal substrate, or the like, and for processing an object to be processed, such as a semiconductor wafer or the like, with use of an active species prepared by plasma generation.

FIG. 34 is a view showing a microwave excitation plasma processing apparatus.

An opening portion 2 is formed in the upper surface of a cylindrical air-tight chamber 1. The opening portion 2 is provided with a dielectric window 3 which encloses the air-tight chamber 1. The dielectric window 3 is made of, for example, alumina, quartz glass, and is arranged in the periphery of the opening portion 2, such that the window 3 is in almost the same plane as the uppermost portion of the air-tight chamber 1.

A rectangular microwave guide 4 is provided on the upper surface of the air-tight chamber 1 with the dielectric window 3 inserted therebetween.

The microwave guide 4 serves to introduce a microwave 5 into the air-tight chamber 1, and is provided on the upper wall portion of the air-tight chamber 1 including the dielectric window 3.

A microwave guide port 6 is opened in a bottom plate portion of the microwave guide 4 which is opposed to the dielectric window 3.

A radiation plate 7 made of mesh punched metal is arranged in the horizontal direction in the air-tight chamber 1, so that the inside of the air-tight chamber 1 is divided into upper and lower portions. Specifically, in the air-tight chamber 1, a plasma generation chamber 8 is formed in the upper side while a processing chamber 9 is formed in the lower side.

A gas supply tube 10 is connected to the side wall of the plasma generation chamber 8.

The processing chamber 9 is provided with a shaft 11, and the shaft 11 is equipped with a wafer holder 12.

The bottom portion of the processing chamber 9 is equipped with an exhausting tube 13. Another end of the exhausting tube 13 is connected with an exhausting system 14.

Explanation will now be made of a method for removing (or ashing) a resist pattern on a semiconductor wafer by the apparatus as described above.

At first, a semiconductor wafer 15 is set on the wafer holder 12 of the processing chamber 9 at the lower portion of the air-tight chamber 1. A resist pattern is formed on the semiconductor wafer 15.

A gas in the air-tight chamber 1 is exhausted through an exhausting tube 13 by operating a vacuum pump of an exhausting system 14.

Meanwhile, a plasma generation chamber 8 in the upper power of the air-tight chamber 1 is supplied with a reaction gas, such as an oxygen gas, through a gas supply tube 10.

At the time point when the internal pressure of the air-tight chamber 1 reaches a predetermined pressure by the supply of a reaction gas, a microwave 5 is supplied to the microwave guide 4. This microwave 5 is introduced through the microwave guide 4, passing through the dielectric window 3 from the microwave guide port 6, into the plasma generation chamber 8.

When a reaction gas is thus supplied to the plasma generation chamber 8 and a microwave 5 is introduced, a plasma 16 is generated in the plasma generation chamber 3. Active species, such as active oxygen atoms and ions, are generated in the plasma 16.

The active species are introduced into the processing chamber 9 through an opening in a radiation plate 7. In the chamber 9 the active species react with the surface of a semiconductor wafer 15 in the processing chamber 9, thereby removing the resist pattern. Thus, so-called ashing is performed.

In the apparatus as described above, a heat generated by a plasma 16 transfers to the dielectric window 3, thereby heating the dielectric window. The heat of the dielectric window 3 is radiated by natural cooling.

However, since high speed processing is carried out, the heat amount received from a plasma 16 generated in the plasma generation chamber 8 is increased as the power of the microwave 5 introduced into the microwave introducing tube 4 is increased. In this manner, the temperature of the dielectric window 3 increases to about 400° C., resulting in a possibility that a heat break-down may occur.

A technique for preventing a heat break-down of the dielectric window 3 is taught, for example, in Japanese Patent Application KOKAI Publication No. 63-130784. This reference teaches that an air supply tube 17 is provided at an upper portion of a microwave introducing tube 4, as shown in FIG. 35.

In this structure, the dielectric window 3 heated in accordance with generation of a plasma 16 is forcedly cooled by blowing an air to the dielectric window 3 through the air supply tube 17 from the microwave introducing tube 4.

However, in order to prevent a heat break-down of the dielectric window 3, an enormous amount of air must be blown to the dielectric window 3 through the air supply tube 17.

For example, in a microwave processing apparatus including a dielectric window 3 having a diameter of 240 mm, when a microwave 5 of 1 kW is introduced into the microwave introducing tube, an air of a flow amount of 200 Nl/min or more must be blown to the dielectric window 3 from the air supply tube 17 in order to prevent a heat break-down of the dielectric window 3, so that only low practical utility can be attained.

In addition, if a large amount of air is supplied into the microwave introducing tube 4, an efficiency of plasma generation by a microwave 5 introduced from the microwave introducing tube 4 is lowered.

BRIEF SUMMARY OF THE INVENTION

The present invention therefore has an object of providing a plasma processing apparatus which is capable of preventing a heat break-down of a dielectric window without supplying a large amount of a cooling gas even when a microwave of a strong power is introduced.

In order to achieve this object, a plasma processing apparatus according to a first aspect of the present invention.

According to a first aspect of the present invention, there is provided a plasma processing apparatus comprising: a microwave guide for guiding a microwave; an airtight chamber for containing an object to be processed; gas-introducing means for introducing a reaction gas into the airtight chamber; a dielectric window provided between the microwave guide and the airtight chamber and closing the airtight chamber; a top plate contained in a part of the microwave guide and arranged, forming a gap jointly with the dielectric window; and cooling means provided on the top plate, for cooling at least the dielectric window, wherein the reaction gas is supplied into the airtight chamber while the microwave is being guided into the airtight chamber, thereby to generate a plasma and process the object.

According to a second aspect of the present invention, there is provided a plasma processing apparatus wherein the cooling means introduces a cooling gas between the dielectric window and the top plate.

According to a third aspect of the present invention, there is provided a plasma processing apparatus wherein the cooling means has a meandering partition member located between the dielectric window and the top plate, defining a band-shaped path for allowing passage of a cooling gas.

According to a fourth aspect of the present invention, there is provided a plasma processing apparatus wherein the cooling means has a spiral partition member located between the dielectric window and the top plate, defining a spiral path for allowing passage of a cooling gas.

According to a fifth aspect of the present invention, there is provided a plasma processing apparatus wherein the cooling means comprises a plurality of gas guiding portions for guiding the cooling gas from an outer rim of the dielectric window and the spiral path extending from the outer rim of the dielectric window and communicating with the gas guiding portions.

According to a sixth aspect of the present invention, there is provided a plasma processing apparatus wherein at least one of a decompression portion for 1decompressing the cooling gas and a temperature control portion for controlling a temperature of the cooling gas is provided on the spiral path.

According to a seventh aspect of the present invention, there is provided a plasma processing apparatus further comprising a cooling liquid path provided in the top plate, for guiding a cooling liquid to cool the top plate.

According to an eighth aspect of the present invention, there is provided a plasma processing apparatus further comprising: a pair of slot antennas provided near both walls of the microwave guide; a space provided between the pair of slot antennas in the top plate; a cooling gas path having an end communicating with the space and another end connected to a gas introducing port for supplying a cooling gas; and a plurality of cooling gas guiding holes formed in the top plate, for guiding the cooling gas from the space and between the top plate and the dielectric window.

According to a ninth aspect of the present invention, there is provided a plasma processing apparatus wherein the cooling gas introducing holes are arranged more densely at a center portion of the top plate than at another portion thereof.

According to a tenth aspect of the present invention, there is provided a plasma processing apparatus further comprising a cooling liquid path provided in the space, for guiding a cooling liquid.

According to an eleventh aspect of the present invention, there is provided a plasma processing apparatus further comprising: a flow path provided in the top plate, for allowing passage of a cooling gas or a cooling liquid; and a sheet provided between the top plate and the dielectric window, having a higher thermal conductivity than air, and being heat-resistant.

According to a twelfth aspect of the present invention, there is provided a plasma processing apparatus comprising: a microwave guide for guiding a microwave; an airtight chamber for containing a reaction gas: gas-introducing means for introducing a reaction gas into the airtight chamber; a slot antenna contained in a part of the microwave guide, for guiding the microwave through the microwave guide into the airtight chamber, wherein the slot antenna has a plurality of slots and comprises a first metal plate and a second metal plate which are connected together, the first metal plate comprises a connector strip and a plurality of parallel strips connected at one end by the connector strip and spaced apart at predetermined intervals and defining the width of the slots; and the second metal plate comprises a plurality of L-shaped strips, each fitted between adjacent two of the parallel strips, allowing the parallel strips to slide, and defining a slot having a predetermined length and a predetermined width equal to the predetermined interval.

According to a thirteenth aspect of the present invention, there is provided a plasma processing apparatus further comprising a plunger provided between the microwave guide and the slot antenna and comprising a body and a leaf spring mounted on the body, wherein the first metal plate and the second metal plate are electrically connected to an end of the microwave guide by the plunger, and at least one parallel strip of the first metal plate is arranged to slide with respect to the plunger.

According to a fourteenth aspect of the present invention, there is provided a plasma processing apparatus wherein the first metal plate has an elliptical screw hole having a major axis extending in a lengthwise direction of the first metal plate.

According to a fifteenth aspect of the present invention, there is provided a plasma processing apparatus comprising: a microwave guide for guiding a microwave; a slot antenna provided in a part of the microwave guide, for radiating a microwave traveling through the microwave guide; an airtight chamber in which a plasma is generated from a reaction gas by applying the microwave from the slot antenna to the reaction gas, and reaction species generated by the plasma are used to process an object; a microwave guide window provided between the microwave guide and the airtight chamber and closing the airtight chamber; a reinforcement member provided outside the airtight chamber; and a beam structure connected to the reinforcement member and supporting the microwave guide window in the airtight chamber.

According to a sixteenth aspect of the present invention, there is provided a plasma processing apparatus wherein the reinforcement member is made of material having a longitudinal elasticity coefficient of $8.0 \times 10^3$ kg/mm$^2$.

According to a seventeenth aspect of the present invention, there is provided a plasma processing apparatus wherein the reinforcement member is made of stainless steel or iron.

According to an eighteenth aspect of the present invention, there is provided a plasma processing apparatus wherein the beam structure satisfies a relation of $d/t \geq 10$, where d is the distance between slot antennas and t is the thickness which the beam structure has in the direction of introducing the microwave into the airtight chamber.

According to a nineteenth aspect of the present invention, there is provided a plasma processing apparatus wherein the beam structure satisfies a relation of $d/g \geq 3$, where d is the distance between slot antennas and g is the width which the beam structure has in the direction the pitch d is measured.

According to a twentieth aspect of the present invention, there is provided a plasma processing apparatus wherein the beam structure satisfies a relation of d/g≧3, where d is the distance between slot antennas and g is the width which the beam structure has in the direction the pitch d is measured.

According to a twenty-first aspect of the present invention, there is provided a plasma processing apparatus wherein the slot antenna has a tapered edge.

According to a twenty-second aspect of the invention, there is provided a method of processing an object with a plasma, which comprises the steps of: placing the object in an airtight chamber; introducing a reaction gas into the airtight chamber; applying a microwave through a microwave guide to the reaction gas in the airtight chamber, thereby generating a plasma; applying the plasma to the object, thereby processing the object; and cooling the microwave guide.

According to a twenty-third aspect of this invention, there is provided a method of processing an object with a plasma, comprising the steps of: placing the object in an airtight chamber; introducing a reaction gas into the airtight chamber; applying a microwave through a microwave guide to the reaction gas in the airtight chamber, thereby generating a plasma; applying the plasma to the object, thereby processing the object; and compensating for thermal expansion of the microwave guide.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 5 is a view showing a microwave excitation plasma processing apparatus according to a second embodiment of the invention;

FIG. 6 is an enlarged cross-sectional view of a main part of the apparatus;

FIG. 9 is a view showing a modification of the cooling gas flow path;

FIG. 10 is a view showing the modification example of the cooling gas flow path;

FIG. 11 is a view showing a microwave excitation plasma processing apparatus according to a fourth embodiment of the present invention;

FIG. 12 is a cross-section of a main part of the apparatus;

FIG. 15 is a plan view of the apparatus;

FIG. 16 is a view showing a process plasma processing apparatus according to a sixth embodiment of the present invention;

FIG. 25 is a view showing a slot antenna of a process plasma apparatus according to a tenth embodiment of the present invention;

FIG. 26 is a view showing a slot antenna of a process plasma apparatus according to an eleventh embodiment of the present invention;

FIG. 27 is a view showing a slot antenna of a process plasma apparatus according to a twelfth embodiment of the present invention;

FIG. 32 is a view illustrating a slot antenna having cooling means;

FIG. 33 is a cross-sectional view of a plasma-generating chamber which incorporates the slot antenna shown in FIG. 32;

DETAILED DESCRIPTION OF THE INVENTION

In the following, a first embodiment of the present invention will be explained with reference to a first embodiment of the present invention.

Figure 1:
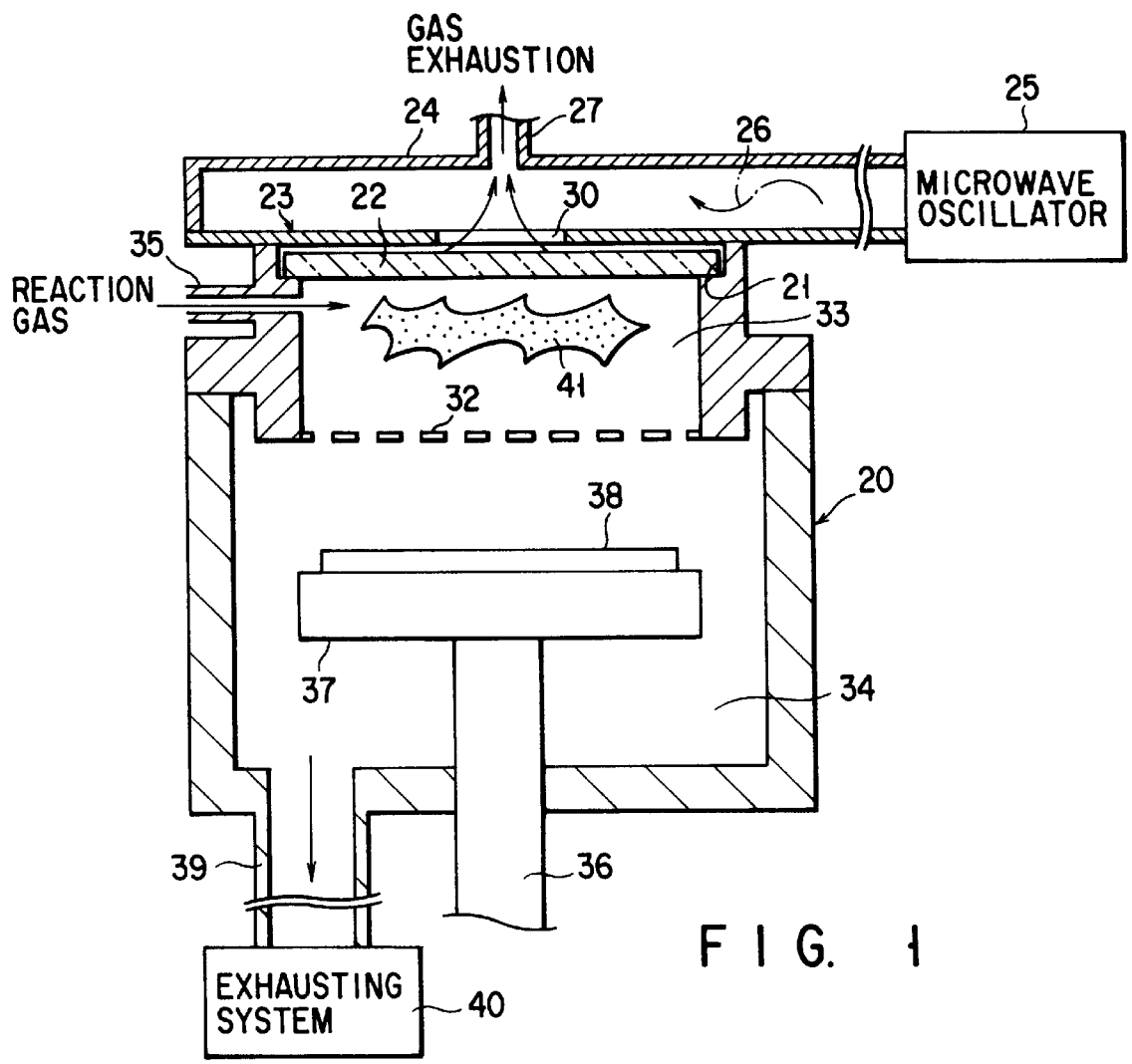
FIG. 1 is a view showing a microwave excitation plasma processing apparatus according to a first embodiment of the present invention.
Figure 2:
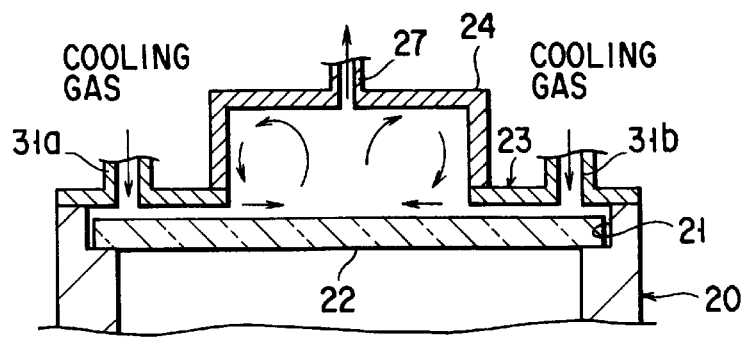
FIG. 2 is a view showing a main part of the apparatus.

FIG. 1 is a front view showing a structure of a microwave excitation plasma processing apparatus, and FIG. 2 is a view showing a structure of a main part.

An air-tight chamber 20 is opened in its upper portion and a step-like step portion 21 is formed at an upper portion of the side wall.

The step portion 21 is equipped with a dielectric window 22 for enclosing the air-tight chamber 20. The dielectric window 22 is arranged such that the upper surface of the dielectric window 22 is positioned below the uppermost portion of the side wall of the air-tight chamber 20. This dielectric window 22 is made of, for example, microwave-transmitting ceramics, alumina or quartz glass, and is formed in a disc-like shape.

Figure 3:
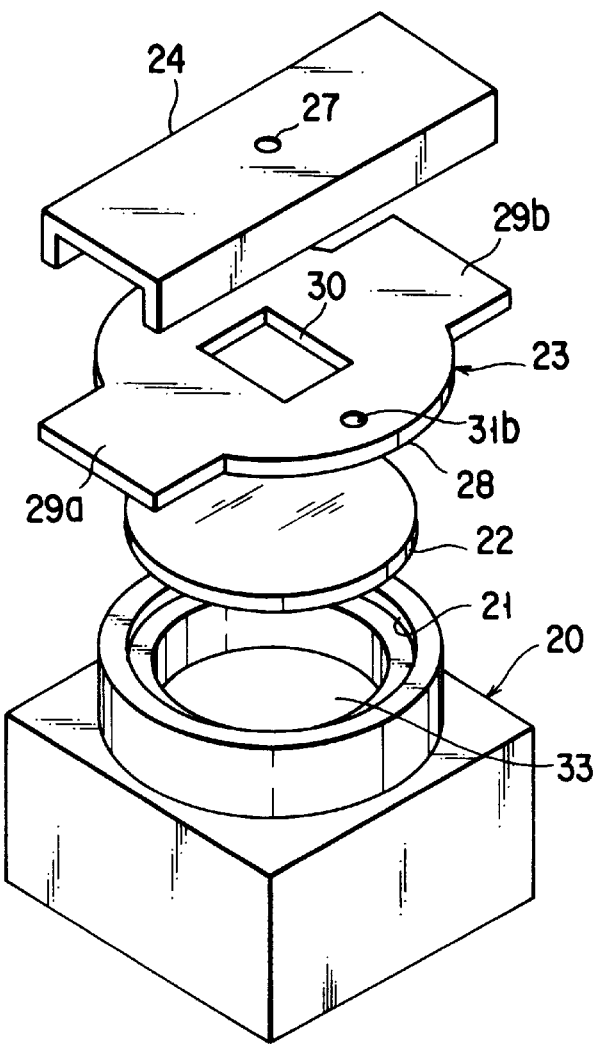
FIG. 3 is an exploded view showing a main part of the apparatus.

The uppermost portion of the air-tight chamber 20 is provided with a top plate 23, as shown in FIG. 3, and a microwave guide 24 is provided on the top plate 23. A predetermined distance is maintained between the top plate 23 and the dielectric window 22, to make a gap.

The microwave guide 24 has a rectangular shape whose bottom portion is opened. Another end of the microwave guide 24 is connected with a microwave oscillator 25. The microwave guide 24 introduces a microwave 26 emitted from a microwave oscillator 25, thereby emitting the wave 26 into the air-tight chamber 20.

The upper wall of the microwave guide 24 is provided with a gas exhausting portion 27. The gas exhausting portion 27 is provided on the portion of the microwave guide 24 which is opposed to the center portion of the dielectric window 22. The portion 27 may be located at any other position, provided that it can exhaust gas.

The top plate 23 consists of a body portion 28 opposed to the dielectric window 22, extended portions 29a and 29b extended so as to cross the body 28 in one direction, and a microwave guide port 30 opened in the substantial center of the body 28.

In addition, the top plate 23 is provided with two cooling gas introducing portions 31a and 31b. These cooling gas introducing portions 31a and 31b are arranged to be symmetrical to each other at positions with a microwave guide 24 inserted therebetween.

Meanwhile, a radiation plate 32 made of mesh-like punched metal is provided horizontally, and a plasma generation chamber 33 and a processing chamber 34 are respectively formed in the upper and lower sides of the plate 32.

The plasma generation chamber 33 has a side wall connected with a supply tube 35 for supplying a reaction gas. This supply tube 35 serves to supply, for example, an oxygen gas as a reaction gas into the plasma generation chamber 33.

In the processing chamber 34, a shaft 36 is provided to be rotatable on the bottom portion. The top end portion of the shaft 36 is provided with a wafer holder 37. On the wafer holder 37, a semiconductor wafer 38 on the surface of which a resist pattern is formed is mounted as a target object to be processed.

In addition, a gas exhausting tube 39 is connected to the bottom portion of the processing chamber 34. Another end of the gas exhausting tube 39 is connected with an exhausting system 40 such as a vacuum pump.

Next, operation of the apparatus constructed as described above will be explained with reference to an example case of ashing on a semiconductor wafer 38.

First, a semiconductor wafer 38 is set on the wafer holder 37 in the processing chamber 34 of the air-tight chamber 20. In this case, the semiconductor 38 is set such that the resist pattern faces upwards.

When the exhausting system 40 is operated, a gas in the air-tight chamber 20 is exhausted through an exhausting tube 39.

Meanwhile, for example, an oxygen gas is supplied as a reaction gas through a supply tube 35 to the plasma generation chamber 33 of the air-tight chamber 20.

When an oxygen gas is supplied into the air-tight chamber 20 and the pressure inside the air-tight chamber 20 reaches a predetermined pressure, a microwave 26 is emitted from the microwave oscillator 25.

The microwave 26 is guided to the microwave guide port 30 of the top plate 23 by the microwave guide 24, and is introduced into the plasma generation chamber 33 through the dielectric window 22 from the microwave guide port 30.

In the plasma generation chamber 33, a microwave is applied to an oxygen gas, thereby generating a plasma 41. Reaction species, such as active oxygen atoms, are generated in the plasma 41. The reaction species are guided into the processing chamber 34 through an opening in the radiation plate 32. The reaction species in the plasma 41, i.e., active oxygen atoms, ions or radicals, react with the surface of a semiconductor wafer 38. The resist pattern is thereby peeled from the wafer 38. Thus, so-called ashing is performed.

Figure 4:
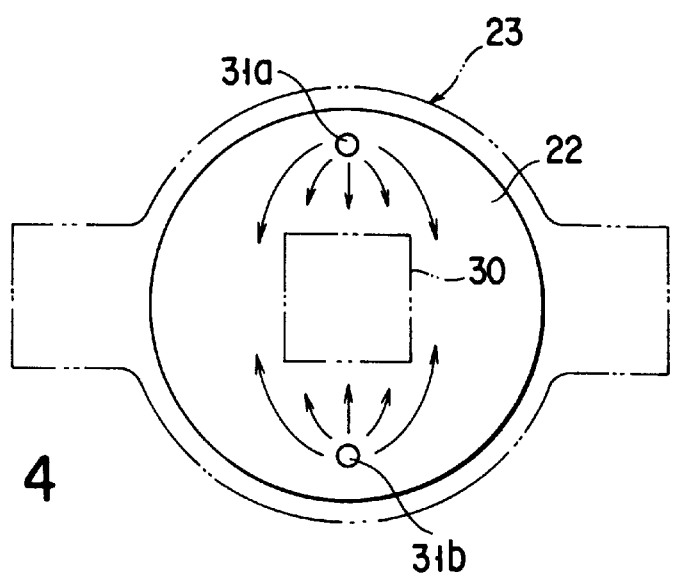
FIG. 4 is a view showing a flow of a cooling gas in the apparatus.

In this ashing, for example, air is introduced as a cooling gas through two gas introducing portions 31a and 31b. The air flows through a gap between the upper surface of the dielectric window 22 and the lower surface of the top plate 23, as shown in FIGS. 2 and 4, and is further exhausted from a gas exhausting portion 27 provided on the upper wall of the microwave guide 24 through the microwave guide port 30 of the top plate 23.

Due to introduction of an air as described above, heat transfer from the dielectric window 22 to the top plate 23 is increased by cooling effected by the air itself and by an air flow into a gap having a small cross-sectional area, so that the dielectric window 22 heated in accordance with generation of a plasma 41 can be efficiently cooled.

Specifically, for example, an air flows between two parallel plates, the heat transfer ratio between the plates can be expressed as follows. Note that an air flows in form of a laminar air flow.

$$Nu = 0.332 Re^{0.500} Pr^{0.333} \quad (1)$$

Nu: Nusselt number

Re: Reynolds number

Pr: Prandtl number (about 0.71 in case of air)

where $$Nu = \alpha h/\lambda \quad (2)$$

α: Heat transfer ratio h: Distance between plates

λ: heat transfer ratio of air (0.0247[W/mk])

$$Re = wh/v \quad (3)$$

w: Flow velocity v: Kinematic viscosity of air ($0.0156 \times 10^{-4}$[m²/sec])

From the above equations (1) to (3), the heat transfer ratio (α) is expressed as follows.

$$\alpha = 1.87 \times (w/h)^{0.500} \quad (4)$$

From the equation (4), the heat transfer ratio (α) from the dielectric window 22 to the top plate 23 can be increased by increasing the flow velocity of the air introduced into a gap between the upper surface of the dielectric window 22 and the lower surface of the top plate 23, and by shortening the distance of the gap (h). Therefore, the dielectric window 22 is efficiently cooled.

Thus, in the first embodiment described above, a gap is formed between the dielectric window 22 and the top plate 23, and a cooling gas is arranged so as to flow through the gap, so that the dielectric window 22 can be efficiently cooled by a supply amount of air smaller than in a conventional apparatus and a heat break-down of the dielectric window 22 can be effectively prevented.

In addition, since an air passing through the gap is introduced into the microwave guide 24, the microwave guide 24 itself can be cooled.

(2) Next, a second embodiment of the present invention will be explained with reference to the drawings. Note that those components in this figure which are the same as those shown of FIGS. 1 to 4 are referred to by the same references, and detailed explanation of those components will be omitted herefrom while only the main part of the embodiment will be explained below.

FIG. 5 is a plan view showing a state in which a band-like meandering cooling gas flow path is formed in a gap between a top plate 23 and a dielectric window 22. FIG. 6 is an enlarged cross-section showing a main part of the apparatus.

Two partition members 50 each having a columnar shape are provided so as to meander in a gap between the lower surface of the top plate 23 and the upper surface of the dielectric window 22. These partition members 50 are made of heat-resistance resin, e.g., polytetrofluoroethylene.

Due to the meandering arrangement of the partition members 50, two pairs of band-like cooling gas flow paths 51a and 51b are formed. The cooling gas flow paths 51a and 51b are formed to be surrounded by the upper surface of the dielectric window 22, the lower surface of the top plate 23, and the partition members 50.

Concave portions 52 in which partition members 50 are respectively embedded are formed in the lower surface of the top plate 23, as shown in FIG. 6. Further, the partition members 50 are respectively engaged in the concave portions 52.

In addition, ends of the cooling gas flow paths 51a and 51b respectively communicate with the cooling gas introducing portions 31a and 31b, and the other ends thereof communicate with the microwave guide port 30 of the top plate 23. Note that the ends of the cooling gas flow paths 51a and 51b communicating with the port 30 are arranged so as to oppose each other.

Next, operation of an apparatus constructed as described above will be explained with reference to an example of ashing on a semiconductor wafer 38.

A semiconductor wafer 38 is set on a wafer holder 34 in a processing chamber 34, and a gas in an air-tight chamber 20 is exhausted through an exhausting tube 39 by means of operation of the exhausting system 40.

Meanwhile, for example, an oxygen gas as a reaction gas is supplied to a plasma generation chamber 33 of the air-tight chamber 20 through a supply tube 35. When the pressure in the air-tight chamber 20 reaches a predetermined pressure, a microwave 26 is emitted from the microwave oscillator 25.

The microwave 26 runs through the microwave guide 24 and is introduced into the plasma generation chamber 33 through a dielectric window 22 from the microwave guide port 30.

In this plasma generation chamber 33, a microwave is applied to an oxygen gas, thereby generating a plasma 41.

Active species, such as active oxygen atoms, are generated in the plasma 41. The active species are introduced into the processing chamber 34 through an opening in the radiation plate 32. The active species, such as active oxygen atoms, ions or radicals, in the plasma 41 react with the surface of the semiconductor wafer 38, thus performing ashing.

In this ashing, for example, air as a cooling gas is introduced from two gas introducing portions 36a and 36b.

This air flows through cooling gas flow paths 51a and 51b formed between the upper surface of the dielectric window 22 and the lower surface of the top plate 23, as shown in FIG. 5, and is further exhausted from a gas exhausting portion 27 installed on the upper surface of the microwave guide 24 through a microwave guide port 30 opened in the top plate 23.

Thus, in the second embodiment described above, partition members 50 are provided so as to meander between the dielectric window 22 and the top plate 23, and band-like cooling gas flow paths 51a and 51b for allowing a cooling gas to pass are formed by arranging the partition members 50. Therefore, the dielectric window 22 can be efficiently cooled with a much smaller supply amount of air than in a conventional apparatus, and a heat break-down of the dielectric window 22 can be effectively prevented.

Besides, the cross-sectional areas of the cooling gas flow paths 51a and 51b can be smaller than those of the first embodiment. Therefore, the flow velocity of an air can be increased, the heat transfer from the dielectric window 22 to the top plate 23 can be increased on the basis of the equation (4) relating heat transfer, and the dielectric window 22 heated in ih accordance with generation of a plasma 41 can be cooled more effectively.

In addition, when the flow velocity of air is equalized, the flow rate of air can be reduced. Further, by reducing the widths (or cross-sectional areas) of the cooling gas flow paths 51a and 51b in the region of the dielectric window 22 or by densifying the flow paths, the heat radiation amount (or heat transfer amount) from the dielectric window 22 can be increased.

(3) Next, a third embodiment of the present invention will be explained with reference to the drawings. Note that those components of the embodiment which are the same as those in FIGS. 1 to 4 are referred to by the same references, and detailed explanation of the components will be omitted herefrom while only the main part of the embodiment will be explained below.

Figure 7:
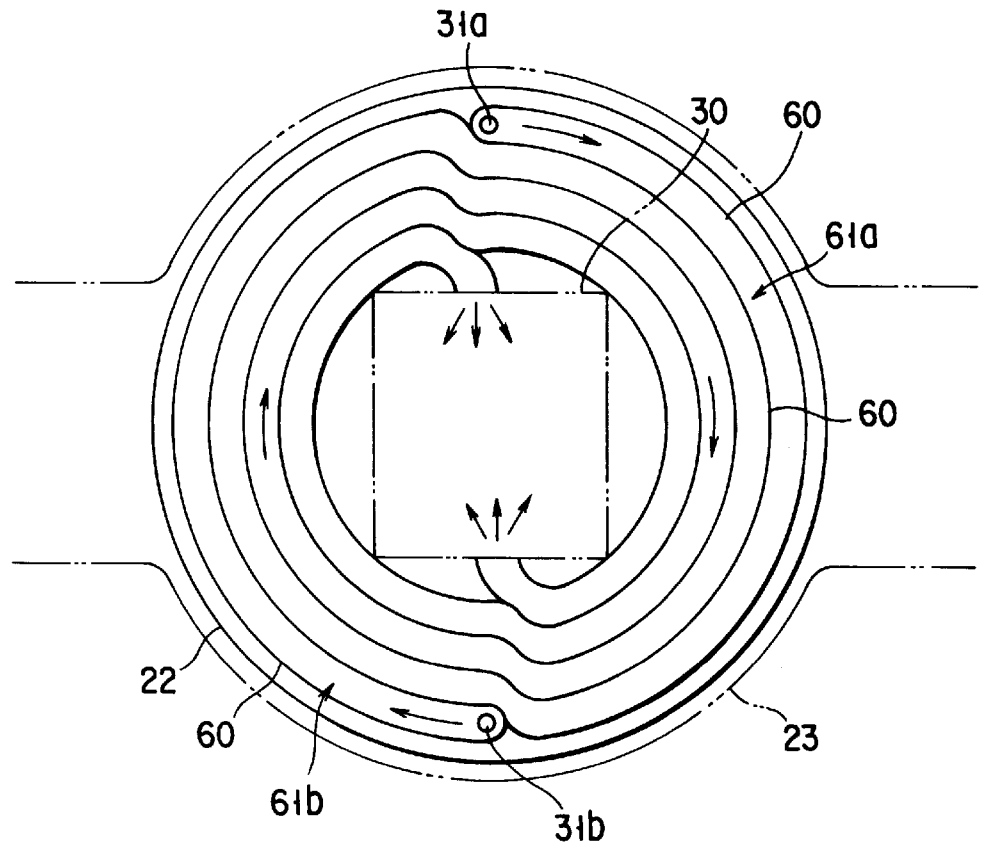
FIG. 7 is a view showing a microwave excitation plasma processing apparatus according to a third embodiment of the invention.
Figure 8:
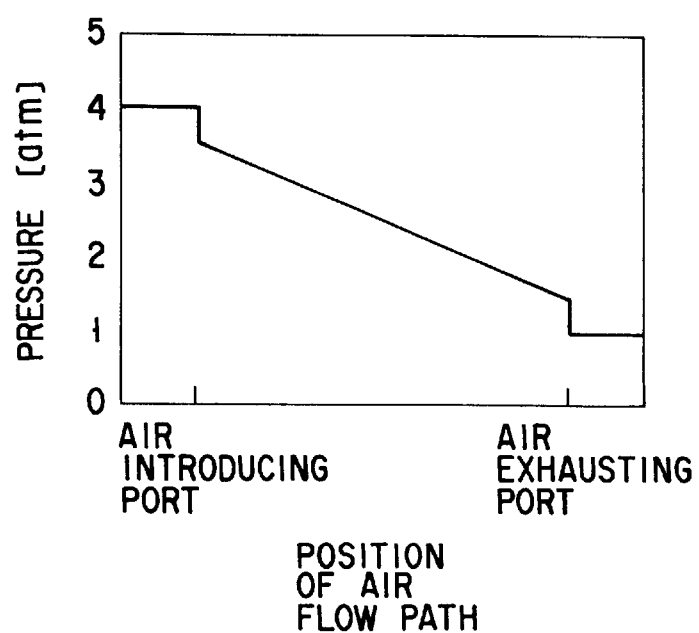
FIG. 8 is a graph representing a pressure distribution in an air flow path.

FIG. 7 is a plan view showing a microwave excitation plasma processing apparatus in which a spiral cooling gas flow path is formed in a gap between a dielectric window 22 and a top plate 23.

Two partition members 60 having each having a columnar cross-section are provided in a gap between the upper surface of the dielectric window 22 and the lower surface of the top plate 23, such that the members extend like spirals from the outer periphery of the dielectric window 22 toward the center thereof. These partition members 60 are made of heat-resistance resin, such as polytetrofluoroethylene.

By thus providing two partition members 60, two sets of band-like cooling gas flow paths 61a and 61b are formed. These cooling gas flow paths 61a and 61b are formed to be surrounded by the upper surface of the dielectric window 22, the lower surface of the top plate 23, and the partition members 60.

Ends of the cooling gas flow paths 61a and 61b communicate with gas introducing portions 31a and 31b, and the other ends of the paths 61a and 61b are arranged to be opposite to each other at the microwave guide port 30 of the top plate 32.

Next, operation of the apparatus constructed as described above will be explained with reference to ashing on a semiconductor wafer 38.

As in the embodiments described above, a semiconductor wafer 38 is set on a wafer holder 37 in the processing chamber 34 and a gas in an air-tight chamber 20 is exhausted through an exhausting tube 39 by operation of the exhausting system 40.

Meanwhile, for example, an oxygen gas as a reaction gas is supplied to the plasma generation chamber 33 of the air-tight chamber 20 through the supply tube 35. When the pressure inside the air-tight chamber 20 reaches a predetermined pressure, a microwave 26 is emitted from the microwave oscillator 25.

The microwave 26 runs through the microwave guide 24 and is introduced into the plasma generation chamber from the microwave guide port 30 through the dielectric window 22.

In the plasma generation chamber 33, a microwave is applied to an oxygen gas, thereby generating a plasma 41. Active species, such as active oxygen atoms, are generated in the plasma 41. The active species are introduced through an opening in the radiation plate 32 into the processing chamber 34. The active species, such as oxygen atoms, ions or radicals, react with the surface of a semiconductor wafer 38, thereby performing ashing.

In this ashing, for example, air is introduced as a cooling gas from two gas introducing portions 36a and 36b.

This air flows through spiral cooling gas flow paths 61a and 61b formed in a gap between the upper surface of the dielectric window 22 and the lower surface of the top plate 23, as shown in FIG. 7, and is further exhausted from a gas exhausting portion 27 installed on the upper wall of the microwave guide 24 through the microwave guide port 30 opened in the top plate 23.

Thus, in the third embodiment described above, partition members 60 are arranged like spirals between the dielectric window 22 and the top plate 23, to form cooling gas flow paths 61a and 61b. The dielectric window 22 can be efficiently cooled with a smaller supply amount of air than in a conventional apparatus, so that a heat break-down of the dielectric window 22 can be effectively prevented.

The cross-sectional areas of the cooling gas flow paths 61a and 61b can be reduced in comparison with the first embodiment described above. Therefore, the flow velocity of air can be increased, the heat transfer from the dielectric window 22 to the top plate 23 can be increased from the relationship expressed by the equation (4) of heat transfer described above, and the dielectric window 22 heated in accordance with generation of a plasma 41 can be cooled more efficiently.

Mechanical damages can be prevented by applying air from the periphery of the dielectric window toward the center thereof, as will be described below.

Specifically, the pressure of the gas in the gas flow paths gets higher toward the air introducing port, and the pressure is substantially 1 atm at the air exhausting port.

The tolerable pressure against pressure damage on the dielectric window 22 in the gas flow paths is higher at the peripheral portion of the dielectric window 22 and gets lower toward the center portion of the window.

Therefore, air having a high pressure is introduced into the peripheral portion of the dielectric window 22 having a high tolerable pressure and air having a low pressure is introduced into the center portion of the dielectric window 22 having a low tolerable pressure, if two sets of cooling gas flow paths 61a and 61b are arranged in a gap between the upper surface of the dielectric window 22 and the lower surface of the top plate 23, so as to extend from the outer periphery of the dielectric window 22 toward the center thereof, as shown in FIG. 7.

In this manner, the dielectric window 22 is prevented from being mechanically damaged by a pressure force of air.

The above third embodiment may be modified as follows.

For example, the spiral cooling gas flow paths 61a and 61b may be arranged such that constriction portions 63 may be provided at predetermined intervals, as shown in FIG. 9.

In addition, the cooling gas flow paths 61a and 61b may be arranged such that weirs are provided, alternately shifted from each other. In this case, the air flow 65 meanders and can reduce gradually the pressure force of the air.

(4) Next, the fourth embodiment of the present invention will be explained with reference to the drawings. Note that those components of this embodiment which are the same as those in FIGS. 1 to 4 are ireferred to by the same references and detailed explanation of those components will be omitted herefrom while only the main part of the embodiment will be explained.

FIG. 11 is a view showing a structure of a microwave excitation plasma processing apparatus and FIG. 12 is a cross-sectional view of a main part thereof.

In a gap between the upper surface of the dielectric window 22 and the lower surface of the top plate 23, two partition members 60 each having a columnar cross-section are provided like spirals from the outer periphery of the dielectric window 22 toward the center thereof. The partition members 60 are made of heat-resistance resin, such as polytetrofluoroethylene or the like.

By thus providing two partition members 60, two sets of band-like cooling gas flow paths 61a and 61b are formed. These cooling gas flow paths 61a and 61b are formed to be surrounded by the upper surface of the dielectric window 22, the lower surface of the top plate 23, and the partition members 60.

Ends of the cooling gas flow paths 61a and 61b respectively communicate with gas introducing portions 31a and 31b, and the other ends of the flow paths 61a and 61b are arranged opposite to each other at the microwave guide port 30 of the top plate 32.

Decompression members 71a and 71b are respectively connected to middle portions of the cooling gas flow paths 61a and 61b through bypass tubes 70a and 70b.

The decompression members 71a and 71b respectively function to respectively decompress the cooling gases flowing through the bypass tubes 70a and 70b.

Operation of an apparatus constructed in the structure as described above will be explained with reference to an example of ashing on a semiconductor wafer 38.

As in the above embodiment, a semiconductor wafer 38 is set on a wafer holder 37 in a processing chamber 34, and a gas in an air-tight chamber 20 is exhausted through an exhausting tube 39 by operation of the exhausting system 40.

Meanwhile, for example, an oxygen gas is supplied as a reaction gas to a plasma generation chamber 33 of the air-tight chamber 20 through a supply tube 35. When the pressure in the air-tight chamber 20 reaches a predetermined pressure, a microwave 26 is emitted from the microwave oscillator 25.

The microwave 26 runs through the microwave guide 24 and is introduced into the plasma generation chamber 33 through a dielectric window 22 from the microwave guide port 30.

In the plasma generation chamber 33, a microwave is applied to an oxygen gas, generating a plasma 41. Active species, such as active oxygen atoms, are generated in the plasma 41. The active species are introduced into the processing chamber 34 through an opening in the radiation plate 32. The species, such as active oxygen atoms, ions or radicals, react with the surface of a semiconductor wafer 38, thereby performing ashing.

In this ashing, for example, air is introduced as a cooling gas from two gas guide portions 36a and 36b.

The air flows through spiral cooling gas flow paths 61a and 61b formed in a gap between the upper surface of the dielectric window 22 and the lower surface of the top plate 23, and further, is exhausted from a gas exhausting portion 27 installed on the upper wall of a microwave guide 24 through a microwave guide port 30 of the top plate 23.

If air is thus introduced into the cooling gas flow paths 61a and 61b, the cross-sectional areas of the cooling gas flow paths 61a and 61b can be smaller than those of the first embodiment, so that the flow velocity of the air can be increased, the heat transfer from the dielectric window 22 to the top plate 23 can be increased from the relationship described in the equation (4) of heat transfer described above, and the dielectric window heated in accordance with generation of a plasma 41 can be cooled more efficiently.

In addition, the air flowing through the cooling gas flow paths 61a and 61b is introduced through bypass tubes 70a and 70b to decompression members 71a and 71b, thereby reducing the air pressure, and is returned again through the bypass tubes 70a and 70b to the cooling gas flow paths 61a and 61b, so that an air having a pressure lower than the tolerable pressure against pressure damages can be introduced to the vicinity of the center of the dielectric window 22. Thus, it is possible to prevent mechanical damages due to a pressure onto the dielectric window 22.

Note that the same effects can be achieved by providing a temperature control member in place of a decompression member in the above fourth embodiment.

(5) Next, the fifth embodiment of the present invention will be explained with reference to the drawings. Note that those components which are the same as those in FIGS. 1 to 4 are referred to by the same references and detailed explanation of those components will be omitted herefrom while only the main part of the embodiment will be explained below.

Figure 13:
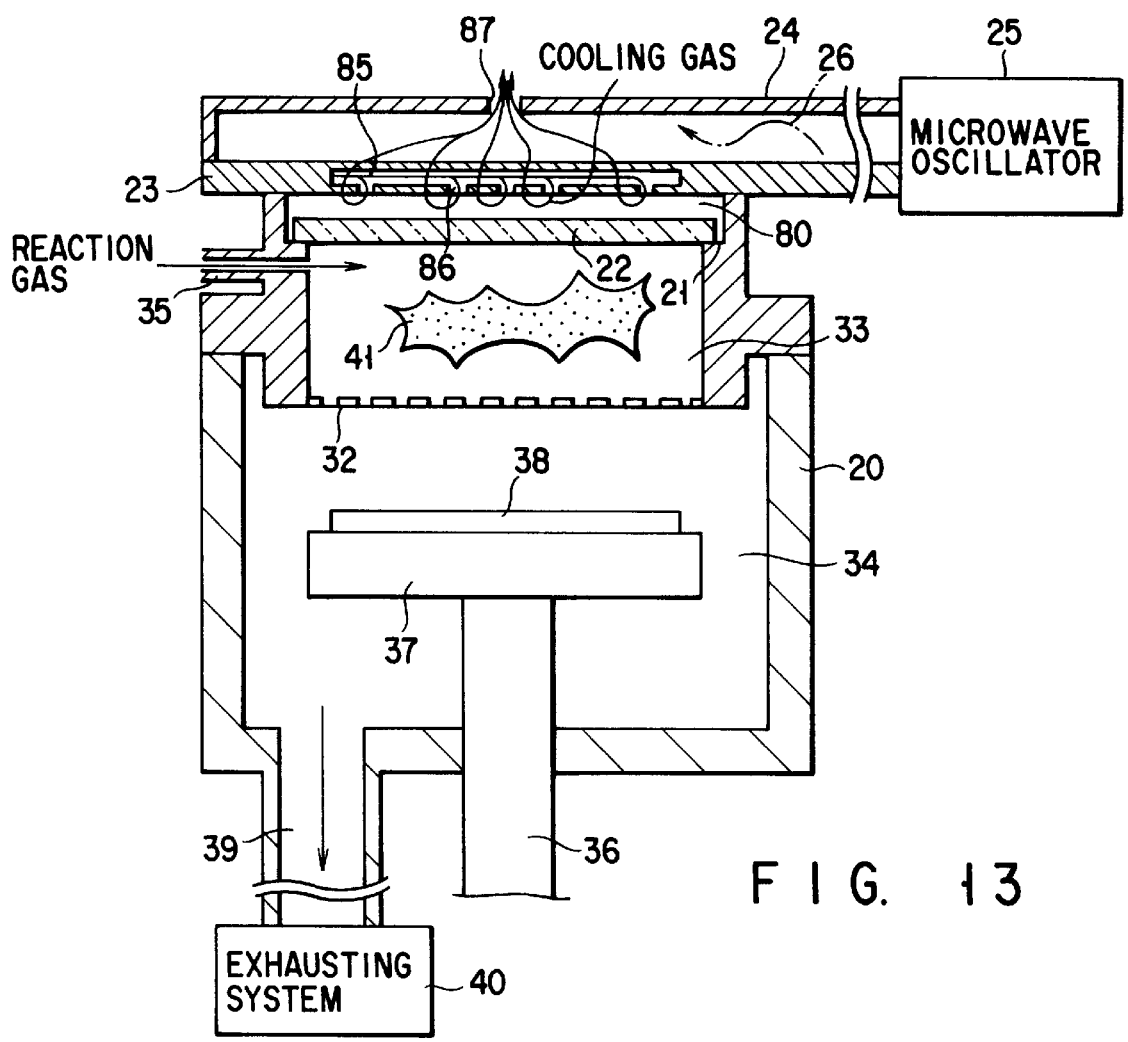
FIG. 13 is a view showing a microwave excitation plasma processing apparatus according to a fifth embodiment of the present invention.
Figure 14:
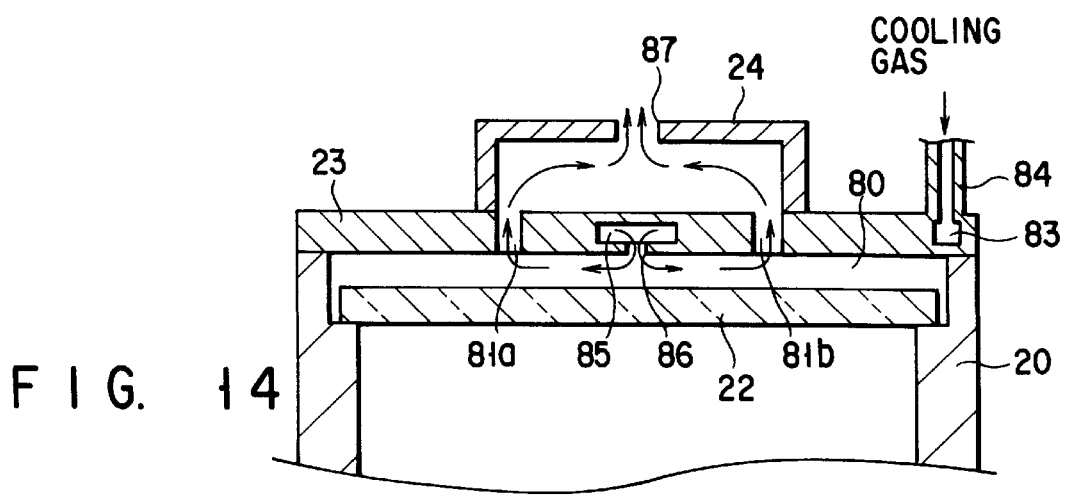
FIG. 14 is a cross-section showing a main part of the apparatus.

FIG. 13 is a view showing a structure of a microwave excitation plasma processing apparatus, and FIG. 14 is a cross-sectional view showing a main part.

A gap portion 80 having a predetermined gap is formed between a dielectric window and a top plate 23. In addition, a pair of slot antennas 81a and 81b for introducing a microwave are formed on the top plate 23. The slot antennas 81a and 81b are formed in a top plate 31 included in the microwave guide 24 and are provided in the vicinity of side walls of the microwave guide 24.

The slot antenna 81a and 81b has a symmetric rectangular shape whose width slightly decreases in the direction toward the wall at the end portion of the microwave guide 24, as shown in FIG. 15, in order that an excellent transfer characteristic is attained for a microwave 26.

Inside the top plate 23, a cooling gas flow path 82 for allowing a cooling gas to pass is provided along the outer periphery of the top plate 23. An end portion of the cooling gas flow path 82 is positioned in the outer side of the microwave guide 24, and is provided with a gas introducing port 83.

This gas introducing port 83 is an inlet port for introducing a cooling gas. This gas introducing port 83 is connected with a gas supply tube 84 from above the top plate 23, as shown in FIG. 14.

A wide space portion 85 is formed between the slot antennas 81a and 81b of the top plate 23. The space portion 85 is formed inside the top plate 23 like the cooling gas flow path 82, and communicates with the cooling gas flow path 82. The space portion 85 is formed in a rectangular shape extending in the forwarding direction of the microwave.

On the lower surface of the space portion 85, a plurality of cooling gas introducing holes 86 are formed for introducing a cooling gas into a gap portion 80. The cooling gas introducing holes 86 are arranged, for example, to be concentrated in the center portion of the top plate 23.

Note that a gas exhaust hole 87 for exhausting a cooling gas is formed in the upper wall of the microwave guide 24. The gas exhausting hole 87 may be connected to a gas exhausting tube not shown. In this case, a cooling gas may be exhausted to the outside by connecting a suction means.

Next, operation of an apparatus constructed as described above will be explained below with reference to an example of ashing on a semiconductor wafer 38.

As in the above embodiment, a semiconductor wafer 38 is set on a wafer holder 37, and a gas inside an air-tight chamber 20 is exhausted through an exhausting tube 39 by operation of an exhausting system 40.

Meanwhile, for example, an oxygen gas as a reaction gas is supplied to the plasma generation chamber 33 of the air-tight chamber 20 through a supply tube 35. When the pressure in the air-tight chamber 20 reaches a predetermined pressure, a microwave 26 is emitted from the microwave oscillator 25.

The microwave 26 runs through the microwave guide 24, and is introduced into the plasma generation chamber 33 from slot antennas 81a and 81b through the dielectric window 22.

In the plasma generation chamber 33, a microwave is applied to an oxygen gas, thereby generating a plasma 41. Active species, such as active oxygen atoms, are generated in the plasma 41. The active species are introduced through an opening in the radiation plate 32 into the processing chamber 34. The active species, such as active oxygen atoms, ions or radicals, react with the surface of the semiconductor wafer 38, thereby performing ashing.

In this ashing, for example, air is introduced as a cooling gas from a gas supply tube 84.

This air flows into a space portion 85 from a cooling gas flow path 82, and is introduced into a gap portion 80 through a plurality of cooling gas introducing holes 86. The air introduced into the gap portion 80 serves to cool the dielectric window 22 and is then exhausted into the microwave guide 24 from the slot antennas 81a and 81b.

The air thus exhausted into the microwave guide 24 is suctioned and exhausted to the outside of the microwave guide 24 through a gas exhausting hole 87 provided at an upper portion of the microwave guide 24.

Thus, in the fifth embodiment as described above, a cooling gas flow path 82 and a space portion 85 communicating with the cooling gas flow path 82 are formed. Air as a cooling gas is made flow through the cooling gas flow path 82 to the space portion 85 and through a plurality of cooling gas guide holes 86 to a gap portion 80, thereby cooling the dielectric window 22, and is then exhausted to a gas exhausting hole 87 through the microwave guide 24 from the slot antennas 81a and 81b. Therefore, the dielectric window 22 heated by generation of a plasma 41 can be efficiently cooled by a supply amount of air which is far smaller than that in case of a conventional apparatus, and a heat break-down of the dielectric window 22 can be efficiently prevented.

(6) Next, a sixth embodiment of the present invention will be explained below with reference to the drawings. Note that those components which are the same as those in FIGS. 1 to 4 and FIGS. 14 to 15 are referred to by the same references, and detailed explanation of those components will be omitted herefrom while only the main part will be explained.

Figure 17:
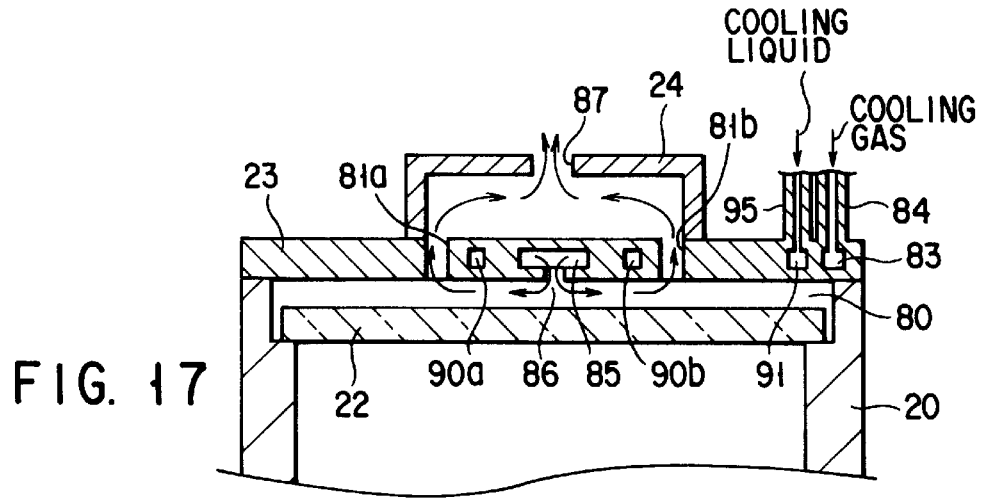
FIG. 17 is a cross-section showing a main part of the apparatus.

FIG. 16 is a view showing a structure of a microwave excitation plasma processing apparatus, and FIG. 17 is a cross-sectional view of a main part of the apparatus.

A gap portion 80 is formed between a dielectric Mwindow 22 and a top plate 23, and a pair of slot antennas 81a and 81b are formed in the top plate 23.

The top plate 23 is internally provided with a cooling gas flow path 82, a gas introducing port 83 as an end portion of the gas flow path, and a gas exhausting hole 87.

The cooling gas flow path 82 communicates with a space portion 85 provided between a pair of slot antennas 81a and 81b. Note that the space portion 85 is formed to have a width narrower than that of the space portion 85 of the fifth embodiment. In other words, in the space portion 85, the number of cooling gas introducing holes 86 formed is smaller than that the number of cooling gas introducing holes 86 in the fifth embodiment.

A pair of cooling liquid flow paths 90a and 90b are formed respectively between the space portion 85 and the slot antennas 81a and 81b. The liquid introducing ports 91 and 92 are respectively connected with liquid supply tubes, as shown in FIG. 17. The liquid supply tubes are connected from above the top plate 23.

The cooling liquid flow path 90a of the flow paths 90a and 90b is curved along a cooling gas flow path 82 from a liquid introducing port 91, and turns around an end portion of the slot antenna 81a, The flow path 90a is further formed linearly between the space portion 85 and the slot antenna 81a, and is then curved along the outer periphery of the top plate 23.

The cooling liquid flow path 90b is curved along the outer periphery of the top plate 23 form a liquid introducing port 92 and turns around an end portion of the slot antenna 81b. The flow path 90b is further formed linearly between the space portion 85 and the slot antenna 81b and is curved again along the outer periphery of the top plate 23.

The other ends of the cooling liquid flow paths 90a and 90b are respectively connected with liquid exhausting ports 93 and 94. The paths 90a and 90b may each be bent sharply, at some portions, not curved as illustrated in FIG. 16.

The liquid exhausting port 93 and 94 are respectively connected with liquid exhausting tubes 95.

Next, operation of the apparatus constructed in the above structure will be explained below with reference to an example of ashing on a semiconductor wafer 38.

Like in the above embodiment, a semiconductor wafer 38 is set on a wafer holder 37, and a gas in an air-tight chamber 20 is exhausted through an exhausting tube 39 by operation of an exhausting system 40.

Meanwhile, for example, an oxygen gas as a reaction gas is supplied to a plasma generation chamber 33 in the air-tight chamber 20 through a supply tube 35. When the pressure inside the air-tight chamber 20 reaches a predetermined pressure, a microwave 26 is emitted from a microwave oscillator 25.

The microwave 26 runs through a microwave guide 24 and is introduced into the plasma generation chamber 33 through a dielectric window 22 from the slot antennas 81a and 81b. In this plasma generation chamber 33, a microwave is emitted to an oxygen gas to generate a plasma 41. The plasma 41 is introduced through an opening in a radiation plate 32 into a processing chamber 34, in which active oxygen atoms in the plasma 41 react with a resist pattern on the surface of the semiconductor wafer 38, thereby performing ashing.

In this ashing, for example, air as a cooling gas is introduced from a gas supply tube 84.

The air flows through a space portion 85 into a gap portion 80 through a plurality of cooling gas introducing holes 86 from a cooling gas flow path 82. The air thus introduced into the gap portion 80 is used to cool the dielectric window 22, and is then exhausted into the microwave guide 24 through slot antennas 81a and 81b.

The air exhausted into the microwave guide 24 is suctioned and exhausted to the outside of the microwave guide 24 through a gas exhausting hole 87 provided at an upper portion of the microwave guide 24.

Simultaneously, a cooling liquid is supplied lto each of liquid introducing ports 91 and 92. The cooling liquid flows through cooling liquid flow paths 90a and 90b and is exhausted from a liquid exhausting tube 95 through liquid exhausting ports 93 and 94.

Thus, in the sixth embodiment, a cooling gas is caused to flow from a cooling gas flow path 82 to a space portion 85 and to flow into a gap portion 80 through a plurality of cooling gas introducing holes 86, so that the dielectric window 22 is cooled. Therefore, like in the fifth embodiment described above, the dielectric window 22 heated by generation of a plasma 41 can be efficiently cooled, and a heat break-down of the dielectric window 22 can be effectively prevented.

In addition, cooling liquid flow paths 90a and 90b are formed so as to cause a cooling liquid to flow. Therefore, the top plate 23 (or microwave guide 35) can be cooled, and the gap portion 80 can be cooled by thus cooling the top plate 23. As a result, the air in the gap portion 80 can be cooled. The flow amount of a cooling gas flowing through a cooling gas flow path 82 can be therefore reduced.

(7) Next, a seventh embodiment of the present invention will be explained with reference to the drawings. Note that those components of this embodiment which are the same as those in FIGS. 1 to 4 are referred to by the same references and detailed explanation of those components will be omitted herefrom while only the main part of the embodiment will be described below.

Figure 18:
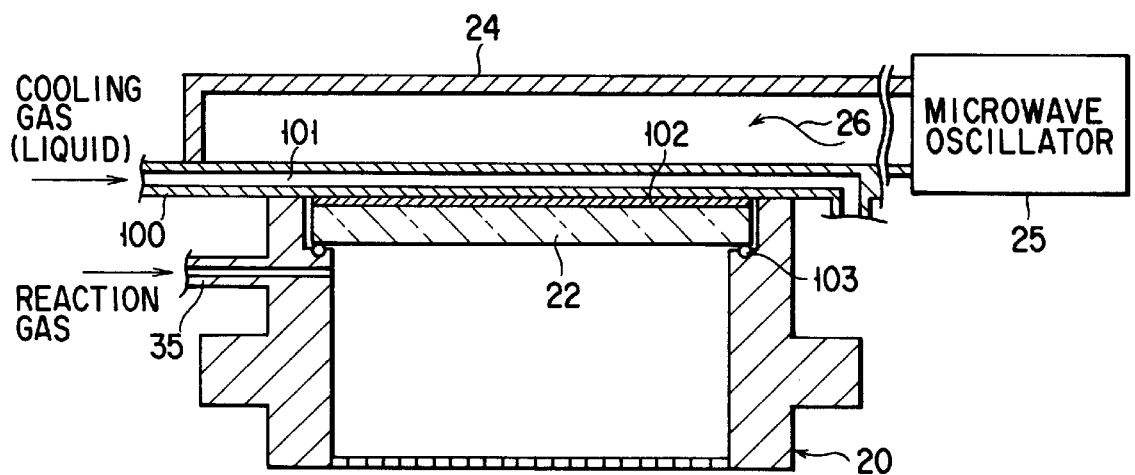
FIG. 18 is a view showing a microwave excitation plasma processing apparatus according to a seventh embodiment of the present invention.
Figure 19:
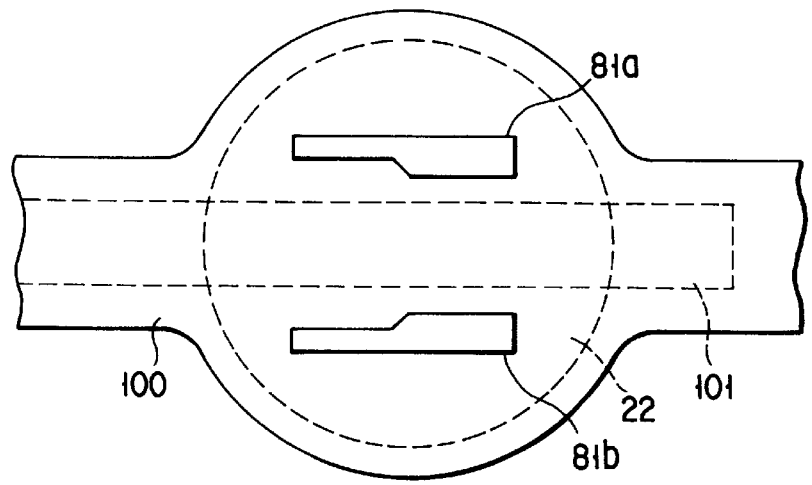
FIG. 19 is a cross-section of a main part of the apparatus.

FIG. 18 is a view showing a structure of a microwave excitation plasma processing apparatus, and FIG. 19 is a cross-sectional view showing a main part thereof.

Cooling of a dielectric window 22 is performed not by introducing a cooling gas between a top plate 23 and a dielectric window 22 and exhausting the gas through a gas exhausting portion, but by indirectly cooling the dielectric window 22 by cooling the top plate 23.

In the following, the structure of the apparatus will be explained.

Inside the top plate 100, a flow path 101 for allowing a cooling gas or a cooling liquid to pass is formed, avoiding slot antennas 81a and 81b, as shown in FIG. 19.

A sheet 102 is provided between the top plate 100 and the dielectric window 22. The sheet 102 is made of material which has a higher heat transfer ratio than air and has a heat-resistance, such as dielectric material like quartz, aluminum nitride, boron nitride, Teflon, or silicon, or material having an elasticity, like silicon rubber or Teflon rubber.

Further, a step portion 21 of an air-tight chamber is provided with an O-ring 103 for providing air-tightness between the container 20 and the dielectric window 22.

Next, operation of the apparatus constructed as described above will be explained below with reference to an example of ashing on a semiconductor wafer.

For example, an oxygen gas as a reaction gas is supplied to an air-tight chamber 20 through a supply tube 35. When the pressure in the air-tight chamber 20 reaches a predetermined pressure, a microwave 25 is emitted from a microwave oscillator 25.

The microwave 26 travels through a microwave guide 24, and is introduced into the air-tight chamber 20 through a dielectric window 22 from slot antennas 81a and 81b.

In the air-tight chamber 20, a microwave is applied to an oxygen gas, generating a plasma. Active oxygen atoms, ions or radicals are generated in the plasma and react with the surface of a semiconductor wafer, thereby performing ashing.

Meanwhile, a cooling gas or a cooling liquid is supplied to a flow path 101 thereby to cool a top plate 100. Since a sheet 102 having a high heat transfer ratio is provided between the top plate 100 and the dielectric window 22, the dielectric window 22 heated by a plasma can be efficiently cooled.

Further, if the sheet 102 is also made of material having an elasticity, deformation can be absorbed and the dielectric window 22 can be protected even when the dielectric window 22, the top plate, or the like is deformed by expansion due to a heat or the like.

The first to seventh embodiments explained above can be modified variously.

The first to seventh embodiments may be modified so that a cooling gas such as air is supplied under a pressure from the side of the microwave guide 24. Instead, the gas exhausting portion may be depressurized by a depressurizing means such a vacuum pump, thereby exhausting the cooling gas (e.g., air) which has been forced into the microwave guide 24. Alternatively, the cooling gas may be introduced into the guide 24 and discharged therefrom by a depressurizing means.

Although two cooling gas flow paths 51a and 51b are provided in the second to fourth embodiments, more cooling gas flow paths may be provided.

Further, a plurality of gas flow paths 82 may be provided in the fifth to sixth embodiments. In the sixth embodiment, the shapes of the cooling liquid flow paths 90a and 90b are not limited to those described before.

A microwave excitation plasma processing apparatus according to the present invention is applicable not only to ashing for pealing a resist pattern on a semiconductor wafer 38, but also to etching of a semiconductor wafer 38 or and forming of a film on a semiconductor wafer 38. The object to be processed is not limited a semiconductor wafer. Rather, it may be the substrates of liquid crystal display.

(8) An eighth embodiment of the present invention will be explained next.

Figure 20:
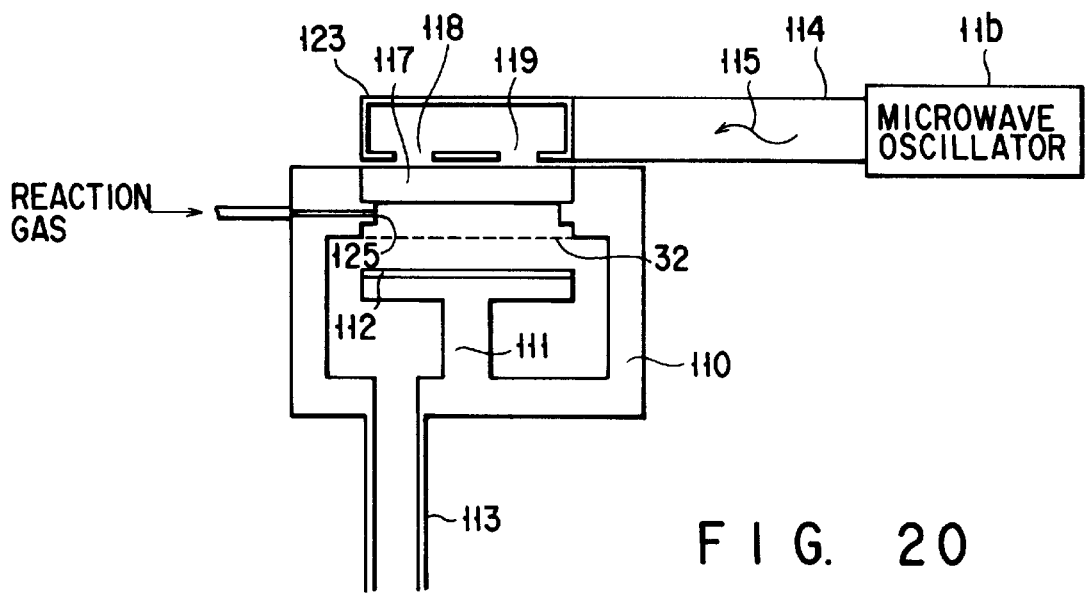
FIG. 20 is a view showing a micro plasma processing apparatus according to an eighth embodiment of the present invention.

FIG. 20 is a view showing a structure of a process plasma apparatus.

A processing stage 111 is provided in an air-tight chamber 110. On the processing stage 111, for example, a substrate 112 such as a liquid crystal substrate is set. The bottom portion of the air-tight chamber 110 is provided with a gas exhausting duct 113.

Note that the air-container 110 is designed to have such a shape and a size that a substrate 112 can be sufficiently stored and a microwave 115 emitted from a microwave guide 114 can be injected uniformly and efficiently into the air-tight chamber 110.

The microwave guide 114 described above for transferring the microwave 115 from a microwave oscillator 116 is provided at an upper portion of the air-tight chamber 110.

The microwave guide 114 is connected to the air-tight chamber 110 through a microwave guide window 117 having an end made of dielectric material.

The microwave guide 114 is formed in an L-shape, extending linearly from the microwave oscillator 116, bent in the vertical direction to above the air-tight chamber 110, and connected to the air-tight chamber 110.

Two slot antennas 118 and 119 parallel to each other are formed on the portion of the microwave guide 114 which is connected to the microwave guide window 117, i.e., on an H-surface vertical to the electric field of the microwave 115 running into the microwave guide 114. Alternatively, the slot antennas 118 and 119 may be formed on an E-surface which is parallel to the magnetic field.

Figure 21:
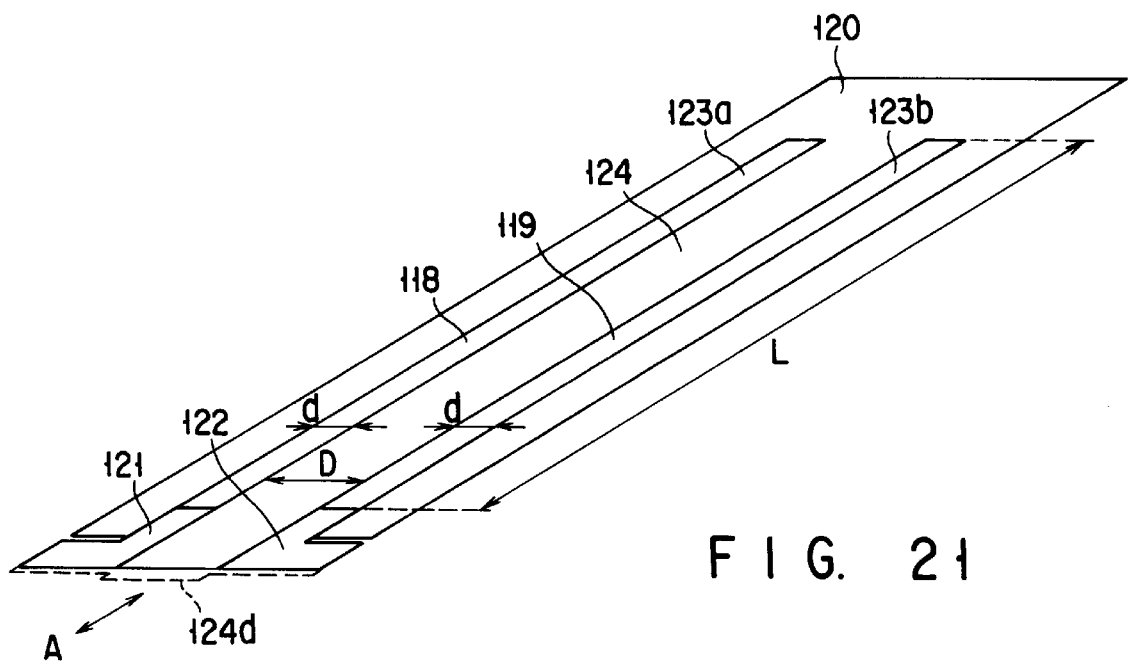
FIG. 21 is a view showing a slot antenna of the apparatus.

The slot antennas 118 and 119 are made from a first metal plate 120 and two second metal plates 121 and 122, as shown in FIG. 21.

Note that the first and second metal plates 120, 121, and 122 are installed on an opening portion of a metal channel 123 having a substantial U-shaped cross-section in the microwave guide 114.

Among the metal plates, the first metal plate 120 is formed in an E-shape having two slot opening portions 123a and 123b parallel to each other in the longitudinal direction. The first metal plate 120 is formed such that the band member 124 formed by the slot opening portions 123a and 123b is slidable in the longitudinal direction (A).

The second metal plates 121 and 122 are respectively formed in L-shapes which are engaged with the slot opening portions 123a and 123b.

The size of each of the two slots, i.e., the slot width d, the slot distance D, and the slot length L are preferably of such values as satisfy the following relations (5) to (7).

Specifically, the slot width d is arranged so as to satisfy the following relation (5) where the wavelength of a microwave 115 transferred in free space is $\lambda o$.

$$d \leq \lambda o/5 \tag{5}$$

The slot distance D is arranged so as to satisfy the following relation (6) where the wavelength of a microwave 115 transferred in free space is also $\lambda o$ and the dielectric ratio of dielectric material forming the microwave guide window 117 is $\epsilon$.

$$2/3[\lambda o/\sqrt{\varepsilon}] \leq D \leq 4/3[\lambda o/\sqrt{\varepsilon}] \tag{6}$$

The slot length L is arranged so as to satisfy the following relation (7) where the wavelength of a microwave 115 transferred in the microwave guide 114 is $\lambda g$ and n is an integer.

$$(2n/3) \cdot \lambda g/2 \leq L \leq (4n/3) \cdot \lambda g/2 \tag{7}$$

The above air-tight container 110 is provided with a nozzle 125. The nozzle 125 is used to supply a reaction gas such as $CF_4$, $O_2$, $Cl_2$, or the like.

Next, operation of an apparatus constructed as described above will be explained below.

A reaction gas such as $CF_4$, $O_2$, $Cl_2$, or the like is supplied into the air-container 110.

Simultaneously, a microwave having a frequency of, for example 2.45 GHz is oscillated from the microwave oscillator 116. The microwave 115 is transferred in each microwave guide 114 in a $TE_{10}$ mode of a rectangular guide and is then emitted from two slot antennas 118 and 119 parallel to each other. The microwave 115 penetrates through a microwave guide window 117 and is then introduced into an air-tight chamber 110.

When a microwave 115 is thus introduced into the air-tight chamber 110, a reaction gas is excited and a plasma is generated.

Upon generation of a plasma, an active species is generated by the generation of the plasma. The active species is supplied onto a substrate 112 and processing (e.g., etching or ashing) is performed on the substrate 112.

In case of use for a long period or turning on a large power, first and second metal plates 120, 121, and 122 forming two slot antennas 118 and 119 are heated by a radiation heat from a plasma or the like.

When the first and second metal plates 120, 121, and 122 are heated, a band member 124 in the center portion of the first metal plate 120 expands most in the lengthwise direction, as shown in FIG. 21. Reference 124a denotes a band member 124 elongated by the expansion.

Since the band member 124 is provided to be slidable on the metal channel 123 of the microwave guide 114 and the microwave guide window 115, an extension of the band member is absorbed by a distortion of the band member without causing a slide of the band member 124 even if a heat expansion is caused by heating with use of a microwave 115.

Therefore, even if the first and second metal plates 120, 121, and 122 are heated to thermally expanding the band member 124, the sizes of two slot antenna 118 and 119 are maintained so as to keep the slot width d, slot distance D, and slot length L expressed by the relations (5) to (7).

Thus, in the eighth embodiment described above, two slot antennas 118 and 119 are formed an E-shape having two slot opening portions 123a and 123b parallel to each other in the lengthwise direction, and the first metal plate 120 forming the band member 124 to be slidable as a center portion formed by the slot opening portions 123a and 123b is combined with the second metal plates 121 and 122 formed in an L-shape engaged with the slot opening portions 123a and 123b. Therefore, even when the first and second metal plates 120, 121, and 122 are heated by receiving a radiation heat, the sizes of two slot antennas 118 and 119 can be maintained to keep the slot width d, slot distance D, and slot length L as initially set, so that a plasma can be generated with a uniform electron density distribution and the active species density on a substrate 4 having a large area can be uniformed.

In this case, the sizes of the slot antennas 118 and 119 can be maintained in initial dimensions of the slot width d, slot distance D, and slot length L without particularly cooling the two slot antennas 118 and 119.

In the air-tight chamber 110, a radiation plate 32 having a plurality of holes are provided like in the first embodiment and divides the air-tight chamber 110 into a plasma generation chamber and a processing chamber. The radiation plate 32 can render the active species density can be uniformed on the substrate 4 of a large area as described above. A radiation plate is made which has a higher numerical aperture than a portion having a high density. For example, the average numerical aperture of the radiation plate can be increased twice, so that the processing speed can be increased twice to contribute to the productivity. The radiation plate 32 prevents a temperature rise of the substrate 4.

(9) Next, the ninth embodiment of the present invention will be explained below. Note that those components of the embodiment which are the same as those in FIG. 20 are referred to by the same references and detailed explanation of those components will be omitted herefrom while the components different from those of the process plasma apparatus shown in FIG. 20 will be explained below.

Figure 22:
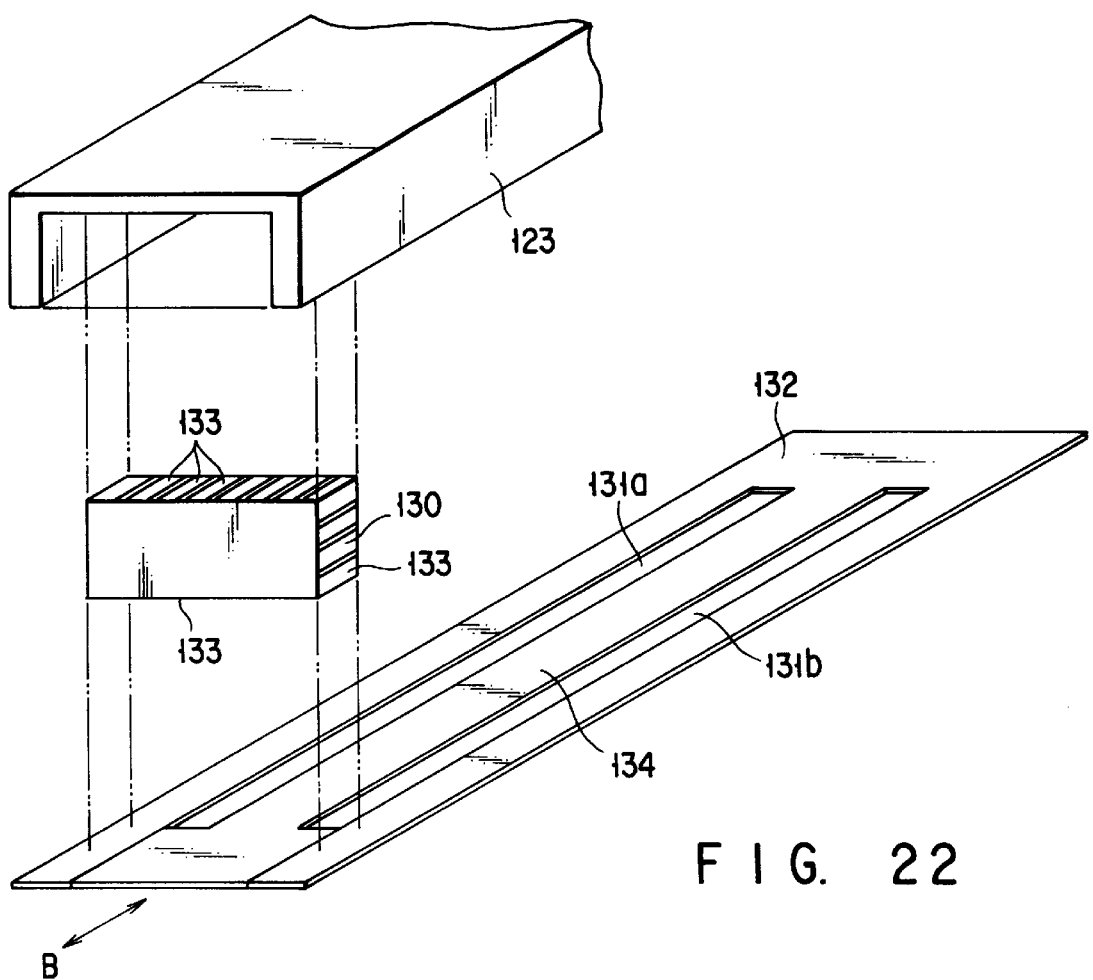
FIG. 22 is a view showing a slot portion of a process plasma apparatus according to a ninth embodiment of the present invention.

FIG. 22 is a view showing a structure of a slot portion applied to the process plasma apparatus.

The rear end portion of the metal channel 123 forming a part of a microwave guide 114 is provided with a metal plate 132 forming slot antennas 131a and 131b through a plunger 130.

Figure 23:
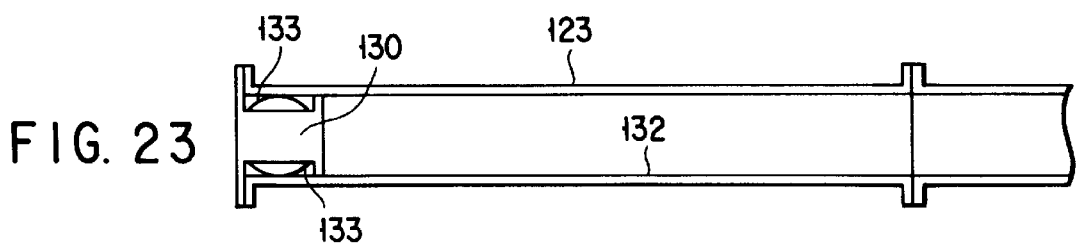
FIG. 23 is a cross-section showing a slot portion of the apparatus.
Figure 24:
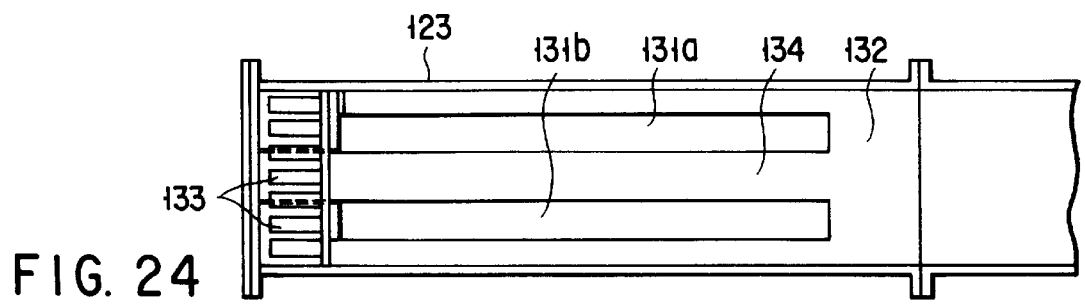
FIG. 24 is a plan view showing a slot portion of the apparatus.

FIG. 23 is a view showing a cross-section of the microwave guide 114 viewed from it side, and FIG. 24 is a view showing a cross-section of a microwave guide 43 from above.

The plunger 130 has a box-like shape which has an outer circumferential surface provided with a plurality of leaf springs 133. The leaf springs 133 are pressed into contact with a metal channel 123 and a metal plate 132. Further, the metal channel 123 and the plunger 130 are electrically connected with the metal plate 132.

Each leaf spring 133 is pressed into contact with the metal channel 123 and the metal plate 132 by its energizing force.

The metal plate 132 is formed in an E-shape having two slot antennas 131a and 131b parallel to each other in the lengthwise direction. The metal plate 132 is formed such that a band member 134 as a center portion formed by the slot antennas 131a and 131b is slidable in the lengthwise direction (B).

The front end portion of the band member 134 as 1the center portion is formed to have a large width by which slot antennas 131a and 131b are formed and a contact with each of the leaf springs 130 of the plunger 130 is obtained.

The two slot antennas 131a and 131b are formed in sizes expressed by the relations (5) to (7) in the eighth embodiment described above, i.e., the slot width d, the slot distance D, and the slot length L.

Next, operation of an apparatus constructed as described above will be explained below.

A reaction gas such as $CF_4$, $O_2$, $Cl_2$, or the like is supplied into the air-tight chamber 110.

Simultaneously, for example, a microwave 115 having a frequency 2.45 GHz is oscillated from a microwave oscillator 116. The microwave 115 is transferred through the microwave guide 114 in a $TE_{10}$ mode of a rectangular guide and is emitted through the two slot antennas 131a and 131b parallel to each other. The microwave 115 then passes through a microwave guide window 117 and is introduced into the air-container 110.

When the microwave 115 is thus introduced into the air-tight chamber 110, a reaction gas is excited to generate a plasma.

An active species is generated by the plasma. The active species is supplied onto a substrate 112 and processing on the substrate 112 is carried out.

Here, in case of use for a long period or turning Ion a large power, a metal plate 132 forming the two slot antennas 131a and 131b is heated by a radiation heat from the plasma or the like.

When the metal plate 132 is thus heated, the band member 134 as the center portion of the metal plate 132 is expanded in the lengthwise direction (B) as shown in FIG. 22.

Since the band member 134 is provided to be slidable by each leaf spring 133 of the plunger 130, an extension of the band member 134 is scattered in the lengthwise direction of the band member 134 by a sliding movement even when a heat expansion is caused.

Therefore, when the metal plate 132 is heated and the band member 134 causes a heat expansion, the band member is not deformed but the sizes of the two slot antennas 131a and 131b are maintained to keep the slot width d, slot distance D, and slot length L expressed in the relations (5) to (7).

Thus, according to the ninth embodiment, like in the eighth embodiment, the sizes of two slot antennas 131a and 131b maintain the initial dimensions of the slot width d, slot distance D and slot length L even when the metal plate 132 is heated by receiving a radiation heat from a plasma, so that a plasma can be generated with a uniform electron density distribution and an active species density can be uniformed on the surface of the substrate 112 having a large area. In this case, the sizes of the slot antennas 131a and 131b can be maintained in the initial dimensions of the slot width d, slot distance D, and slot length L, without particularly cooling the two slot antennas 131a and 131b.

In addition, like in the eighth embodiment, it is not necessary to correct losses due to a radiation plate in order to obtain a uniform active species density and the radiation plate can be prepared with a high numerical aperture with a portion having a high electron density used as a reference. For example, the average numerical aperture of the radiation plate can be increased twice and the processing speed can be increased twice, thereby contributing to the productivity.

Further, since a plunger equipped with leaf plates 133 is provided, it is possible to maintain a sufficient electric connection between the metal channel 123 and the metal plate 132 constituting a microwave guide 114 even when the metal plate 132 is expanded by a heat.

(10) Next, a tenth embodiment of the present invention will be explained below. Note that those components of this embodiment shown in FIG. 20 which are the same as those shown in FIG. 20 are referred to by the same references and detailed explanation thereof will be omitted herefrom while only those components different from those of the process plasma apparatus shown in FIG. 20 will be explained below.

FIG. 25 is a view showing a structure of a slot portion applied to a process plasma apparatus.

An end portion of the metal channel 123 of the microwave guide 114 is equipped with a guide bottom metal plate 140.

The guide bottom metal plate 140 is formed in an E-shape having two slot antennas 141a and 141b parallel in the lengthwise direction. The guide bottom metal plate 140 is formed such that a band member 142 as a center portion formed by the slot antennas 141a and 141b is slidable in the lengthwise direction (C). The top end portion of the band member 142 is formed to have a wide width.

The slot antennas 141a and 141b are formed to have initial sizes of the slot width d, slot distance D, and slot length L expressed in the relation (5) to (7) in the first embodiment.

In this structure, notches 145 are provided between the top end portion of the band member 142 formed to be wide and both of the band members 143 and 144.

A plurality of orbital screw holes 146 are formed at a predetermined interval in each of the band members 143 and 144. The screw holes 146 are formed to have a semimajor axis in the same direction as the lengthwise direction of the band members 143 and 144.

Therefore, the guide bottom metal plate 140 is tightened to the metal channel 123 of the microwave guide, by means of screws 147 having springs.

Next, operation of an apparatus constructed as described above will be explained below.

A reaction gas such as $CF_4$, $O_2$, $Cl_2$, or the like is supplied into an air-tight chamber 110. Simultaneously, a microwave 115 oscillated from a microwave oscillator 116 is transferred through a microwave guide 114, and is emitted from two slot antennas 141a and 141b parallel to each other.

A reaction gas is supplied into the air-tight chamber 40, and a microwave 115 is introduced. Then, a process gas is excited to generate a plasma.

When a plasma is generated, an active species is generated by the plasma and is supplied onto a substrate 112, on which processing (e.g., etching or ashing) is performed.

In case of use for a long period or turning on a large power, a guide bottom metal plate 140 forming two slot antennas 141a and 141b is heated by a radiation heat from the plasma or the like.

When the guide bottom metal plate 140 is thus heated, a band member 142 as a center portion of the plate 140 is expanded in the lengthwise direction (C).

The band member 142 is provided to be slidable in the lengthwise direction, so that an extension of the band member is scattered in the lengthwise direction by a sliding movement of the band member.

In addition, if the band members 143 and 144 in both sides are expanded by receiving a radiation heat from a plasma, the members 143 and 144 are tightened by screws 147 having springs through orbital screw holes 146, so that any extension of the band members is absorbed by sliding movements of these members.

Therefore, even if the guide bottom metal plate 140 is heated and the band member 142 is expanded by a heat, two slot antennas 141a and 141b maintain the dimensions of the slot width d, the slot distance D, and the slot length L expressed by the relations (5) to (7) described before.

According to the tenth embodiment described above, the same advantages as obtained in the eighth embodiment can be achieved.

(11) Next, an eleventh embodiment of the present invention will be explained below. Note that those components which are the same as those shown in FIG. 20 are referred to by the same references and detailed explanation thereof will be omitted herefrom while only those components different from those shown in FIG. 20 will be explained below.

FIG. 26 is a view showing a structure of a slot portion applied to a process plasma apparatus.

An end portion of a metal channel 123 of a microwave guide 114 is equipped with a first metal plate 151 having an E-shape through a plunger 150.

The plunger 150 has a box-like shape and is provided with a plurality of leaf springs 152 on the outer circumferential surface of the plunger.

The leaf springs 152 are pressed into contact with the metal channel 123 and a first metal plate 151. The metal channel 123 and the plunger 150 are electrically connected with the first metal plate 151.

The first metal plate 151 is formed in an E-shape and has two slot antennas 153a and 153b parallel to the lengthwise direction. The first metal plate 151 is formed such that a band member 154 as a center portion formed by the slot antennas 153a and 153b is slidable in the lengthwise direction (E).

The top end portion of the first metal plate 151 is provided with second metal plates 155 and 156 formed in L-shapes which are engaged with the slot antennas 153a and 153b, respectively.

The slot antennas 153a and 153b are formed to have dimensions of the slot width d, slot distance D, and slot length L expressed by the relations (5) to (7) in the first embodiment.

Next, operation of an apparatus constructed as described above will be explained below.

A reaction gas such as $CF_4$, $O_2$, $Cl_2$, or the like is supplied into an air-tight chamber 110. Simultaneously, a microwave 115 oscillated from a microwave oscillator 116 is transferred through a microwave guide 114 and is emitted from two slot antennas 153a and 153b. The microwave 115 passes through a microwave guide window 117 and is introduced into the air-tight chamber 110. Then, a process gas is excited to generate a plasma.

An active species is generated by the plasma and is supplied onto a substrate 112 on which processing (e.g., etching or ashing) is performed.

In case of use for a long period or turning on a large power, a first metal plate 151 and second metal plates 155 and 156 forming two slot antennas 153a and 153b are heated by a radiation heat from a plasma two slot antennas 153a and 153b.

If the first and second metal plates 151, 155, and 156 are heated, the band member 154 of the first metal plate 151 is expanded most in the lengthwise direction (E).

The band member 154 maintains an electric connection through each leaf spring of a plunger 150 and is provided to be slidable in the lengthwise direction. Even if a heat expansion is caused, the extension of the band member is scattered in the lengthwise direction by a sliding movement.

Therefore, if the first and second metal plates 151, 155, and 156 are heated and the band member 154 is expanded by a heat, the sizes of two slot antennas 153a and 153b are maintained at the dimensions of the slot width d, slot distance D, and slot length L expressed by the relations (5) to (7) described above.

Thus, according to an eleventh embodiment, the same advantages as obtained in the eighth embodiment can be achieved.

(12) Next, a twelfth embodiment of the present invention will be explained below with reference to the drawings.

Figure 28:
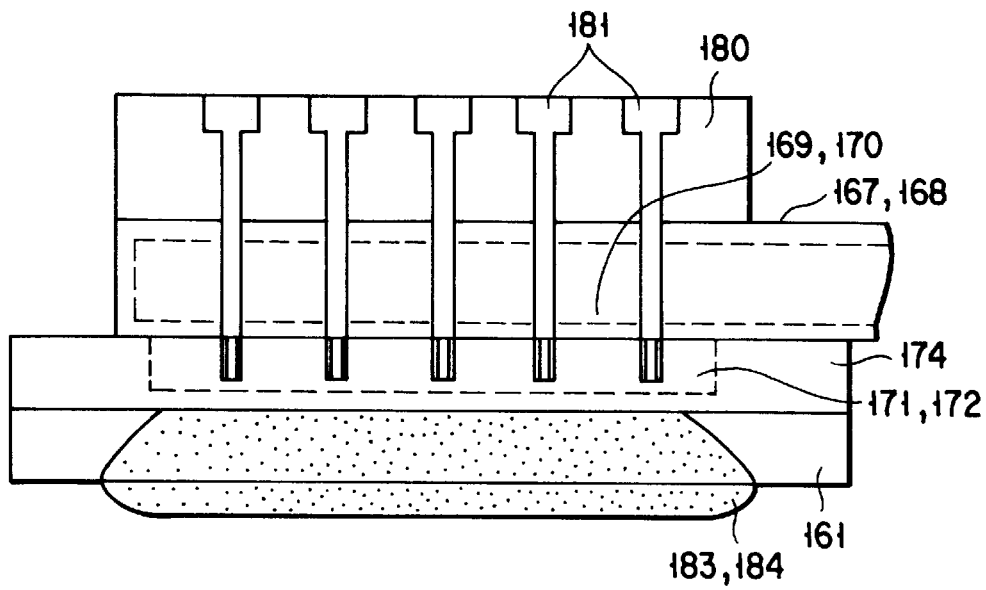
FIG. 28 is a cross-section showing an external reinforcing portion and a plasma generation chamber in the apparatus.

FIG. 27 is a view showing a structure of a process plasma apparatus, and FIG. 28 is a cross-sectional view showing an external reinforcement portion and a plasma generation chamber.

An air-tight chamber 160 comprises a plasma generation chamber 161 and a processing chamber 162. Below the plasma generation chamber 161, a processing stage 163 is provided. A substrate 164 such as a liquid crystal substrate or the like is set on the processing stage 163.

The plasma generation chamber 161 encloses a reaction gas such as $CF_4$, $O_2$, $Cl_2$, or the like. In many cases, for example, the plasma generation chamber 161 uses aluminum from a viewpoint of a demand that the plasma generation chamber 161 should be made of material having a high electric conductivity in order to obtain a corrosion resistance and to enclose a microwave in the plasma generation chamber 161.

Gas supply ports 165 and 166 are provided in both sides of the plasma generation chamber 161. The gas supply ports 165 and 166 serve to supply $CF_4$, $O_2$, $Cl_2$, or the like into the plasma generation chamber 161.

Two microwave guides 167 and 168 are provided at an upper portion of the plasma generation chamber 161. The microwave guides 167 and 168 are used to introduce a microwave oscillated from a microwave oscillator. Slot antennas 169 and 170 are formed on bottom portions of the microwave guides 167 and 168.

Microwave guide windows 171 and 172 are provided on the lower surfaces of the microwave guides 167 and 168. The microwave guide windows 171 and 172 are made of, for example, dielectric material such as quartz, alumina-ceramics, or the like in order to efficiently introduce a microwave into a plasma generation chamber 161.

The microwave guide windows 171 and 172 are arranged and supported in parallel with a beam portion 173. The side wall 174 of the beam portion 173 together with the side wall of the plasma generation chamber 161, i.e., the space surrounded by these walls forms a hollow resonator having a rectangular parallelepiped shape. The hollow resonator serves to resonate and excite a microwave.

An exhausting port 175 is provided at a lower portion of the processing chamber 162.

An external reinforcement portion 180 is provided outside the plasma generation chamber 161. The portion 180 is made of aluminum and is light and corrosion-resistant. Nonetheless, it need not be made of aluminum because the chamber 180 does not contact a plasma or a microwave. It may be made of material having a high flexural strength, such as stainless steel, iron, or the like.

The external reinforcement portion 180 is provided outside the plasma generation chamber 161, between two microwave guides 167 and 168, such that the external reinforcement portion 180 bridges between the two microwave guides 167 and 168.

The microwave resonator 174 in the plasma generation chamber 161 is connected and fixed onto the external reinforcement portion 180, by a plurality of fixing tools 181, e.g., bolts.

O-rings 182 are inserted between the microwave resonator end 174 and the two microwave guide windows 171 and 172, thereby maintaining the air-tightness of the plasma generation chamber 161.

Therefore, the microwave resonator end 174 is fixed to an external reinforcement portion 180, so that a pressure applied to the two microwave guide windows 171 and 172 is supported by the external reinforcement portion 180 and the microwave resonator end 174.

Deformation of the microwave resonator end 174 is, for example, 0.3 mm or less. Thus, damages on the microwave guide windows 171 and 172 are eliminated while equalizing the active species density.

Specifically, since a reinforcement portion is conventionally provided inside the plasma generation chamber 161, the reinforcement portion uses aluminum in order to increase a corrosion resistance. The longitudinal elasticity coefficient (or Young's modulus) of the reinforcement portion is only $7.4 \times 10^3$ kg/mm$^2$ or so, and the cross-section of the beam portion must be increased.

In contrast, according to the present invention, an external reinforcement portion 180 is provided outside the plasma generation chamber 161. It is therefore not necessary to consider corrosion in the plasma generation chamber 161. In view of this, not only aluminum, but also stainless steel having a high rigidity of a longitudinal elasticity coefficient of $2.0 \times 10^4$ kg/mm$^2$ can be used.

In addition, by adopting a structure as described above, the size of the beam can be reduced so that the distance between the slot antennas 169 and 170 can be reduced or the thickness of the beam in the microwave introducing direction can be reduced.

This contributes much to equalization of the active species density of an active species generated by plasmas 183 and 184. Specifically, it has been demanded that a distribution ratio of the processing rate indicated by a calculation formula (11) described later should be ±10%. In order to satisfy this demand, the following relation should be satisfied where the distance between the slot antennas 169 and 170 is expressed as d and the width of the beam connecting the slot antennas 169 and 170 with each other is expressed as g.

$$d/g \geq 3 \qquad (8)$$

Where the thickness of the beam in the microwave introducing direction is expressed as t, the following should be satisfied.

$$d/t \geq 10 \qquad (9)$$

Further, where the distance to the processing stage from the slot antennas 169 and 170 in the vertical direction is expressed as f, the following should be satisfied.

$$f/t \geq 3 \qquad (10)$$

For example, where the distance f to the processing stage 163 from the slot antennas 169 and 170 in the vertical direction is set to 150 mm, the in-plane distribution ratios of the processing rate on the substrate 164 are 8 to 9%, ±10%, and 30%, respectively, when the thickness t of the beam in the microwave introducing direction is changed to 10 mm, 18 mm, and 36 mm.

From these results, it is considered that the uniformity of the in-plane distribution of 30% is too large. Therefore, the thickness t of the beam in the microwave introducing direction should be 18 mm or less.

In order to satisfy the above conditions, the sizes should be arranged such that the distance d between the slot antennas 169 and 170 is 220 mm, the width g of the beam is 46 mm, the distance f to the processing stage 163 from the slot antennas 169 and 170 is 150 mm, and the thickness t of the beam is 18 mm.

The above are data obtained from experiments by the applicants.

The above conditions are satisfied by using an external reinforcement portion 180 according to the present invention.

In the structure as described above, a microwave transferred through two microwave guide 167 and 168 is emitted from slot antennas 169 and 170 and is introduced into a plasma generation chamber 161 through microwave guide windows 171 and 172.

Simultaneously, a reaction gas such as $CF_4$, $O_2$, $Cl_2$, or the like is supplied to the plasma generation chamber 161 through the gas supply ports 165 and 166.

As a result, a reaction gas in the plasma generation chamber 161 is excited by a microwave to generate plasmas 183 and 184.

Here, since the beam portion 173 in the plasma generation chamber 161 is a microwave resonator end 174 having a cross-section ratio smaller than that of a beam portion of a conventional apparatus, an active species generated by plasmas 183 and 184 spreads and is distributed uniformly in the plasma generation chamber 161.

The active species generated by the plasma 183 and 184 is transported by a gas flow toward an exhausting port 175 and subjecting a substrate 164 to processing.

Thus, in the-twelfth embodiment described above, an external reinforcement portion 180 is provided outside a plasma generation chamber 161, and a microwave resonator end 174 is connected and fixed to the external reinforcement portion 180 by a fixing tool 181. Therefore, the beam portion 173 in the plasma generation chamber 161 is arranged to have a cross-section ratio reduced by half or more than a beam portion of a conventional apparatus, so that it is possible to make uniform the active species density of an active species generated by plasmas 183 and 184 in the plasma generation chamber 161 in which processing is performed on a substrate 164 such as a liquid crystal substrate or the like having a large area.

As a result of this, plasma losses (caused by metal of a beam portion) on the metal surface in the plasma generation chamber 161 can be greatly reduced, and the process speed can be increased immediately under the beam portion. The etching rate or ashing rate immediately under the beam portion 173 can be greatly improved.

Specifically, as shown in FIG. 27, the etching or ashing rate e1 of a conventional apparatus can be improved to the etching or ashing rate e2 of the apparatus according to the present invention, so that the uniformity of the etching or ashing on a substrate 164 can be increased.

Specifically, the distribution ratio of rates in a plane of the substrate 164, expressed by the following formula (11), is from ±30% to ±10% so that the uniformity of the processing rates in the plane is improved.

$$\text{Distribution ratio}=(R_{max}-R_{min})/(R_{max}+R_{min})\times 100 \qquad (11)$$

Here, Rmax and Rmin are respectively the maximum and minimum values of the processing rate in the plane of the substrate 164.

In addition, since it is not necessary to consider losses of the active species generated by plasmas 183 and 184, the size of an external reinforcement portion 180 can be enlarged and the deformation of the microwave resonator end 174 can be extremely reduced.

Note that the twelfth embodiment described above has been explained with reference to a case in which two microwave guide windows 171 and 172 are provided. However, in case where a plurality of microwave guide windows and a plurality of beam portions exist, the active species density in the plasma generation chamber 161 can be uniformed with use of a plurality of external reinforcement portions 180.

(13) Next, a thirteenth embodiment of the present invention will be explained with reference to the drawings.

The present invention shows other modifications of slot antennas 81*a* and 81*b*, slot antennas 118 and 119, apparatuses according to the fifth to twelfth embodiments described above.

Figure 29:
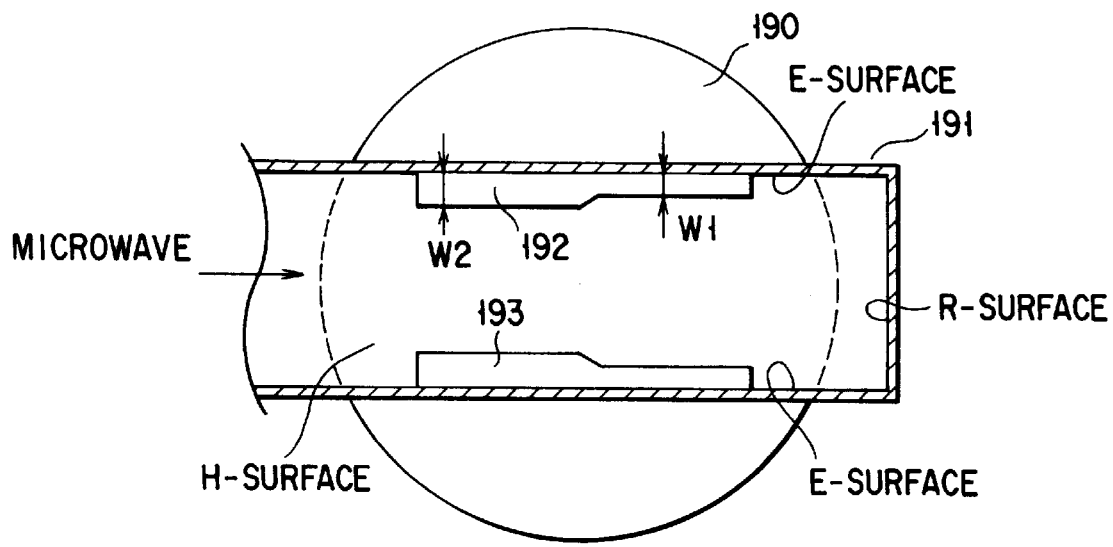
FIG. 29 is a view showing a slot antenna of a process plasma apparatus according to a thirteenth embodiment of the present invention.

FIG. 29 is a view showing a structure of each slot antenna in a plasma processing apparatus.

A microwave guide 191 is connected onto a dielectric window 190. The microwave guide 191 faces the dielectric window 190 and has a surface (H-surface) vertical to the electric field direction of a microwave, a surface (E-surface) parallel to the electric field direction of a microwave extending vertically with respect to the H-surface, and a reflection surface (or short-circuit surface: R-surface) which reflects a microwave and is arranged to be vertical to the H-surface and the E-surface, in the side opposite to the microwave introducing side.

On the bottom surface of the microwave guide 191, two slot antennas 192 and 193 are formed. The slot antennas 192 and 193 are respectively formed on both sides of the microwave guide 191.

Each of the slot antennas 192 and 193 is formed to have two slot widths w1 and w2.

Figure 30:
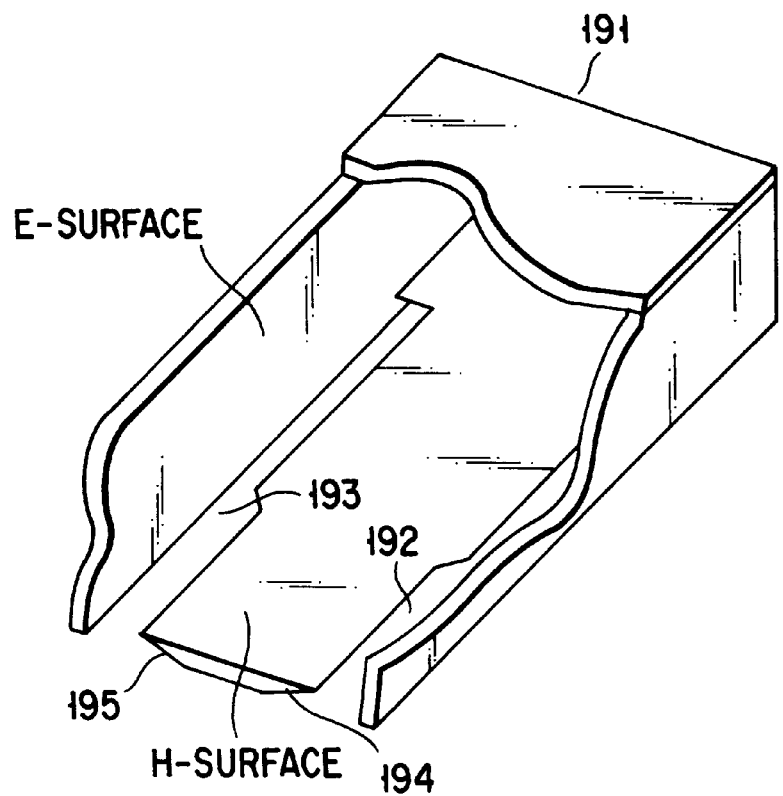
FIG. 30 is an exterior view of the slot antenna viewed from the above.
Figure 31:
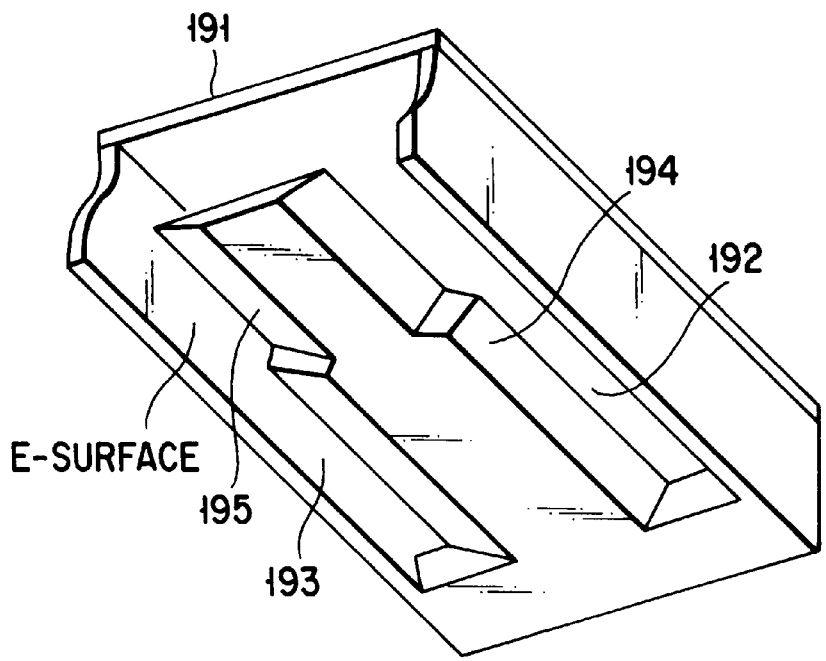
FIG. 31 is an exterior view of the slot antenna viewed from the below.
Figure 34:
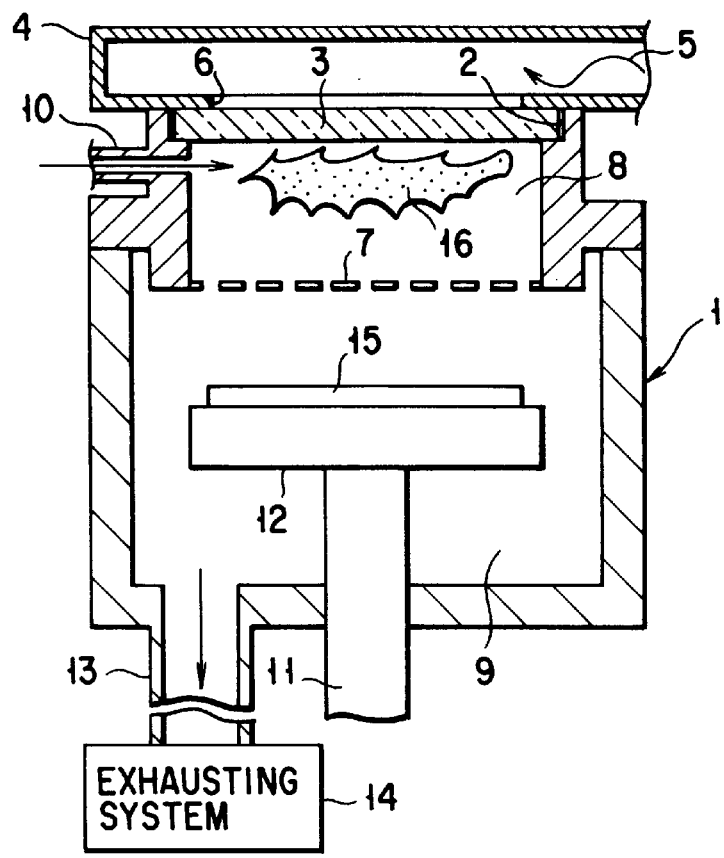
FIG. 34 is a view showing a conventional plasma processing apparatus.
Figure 35:
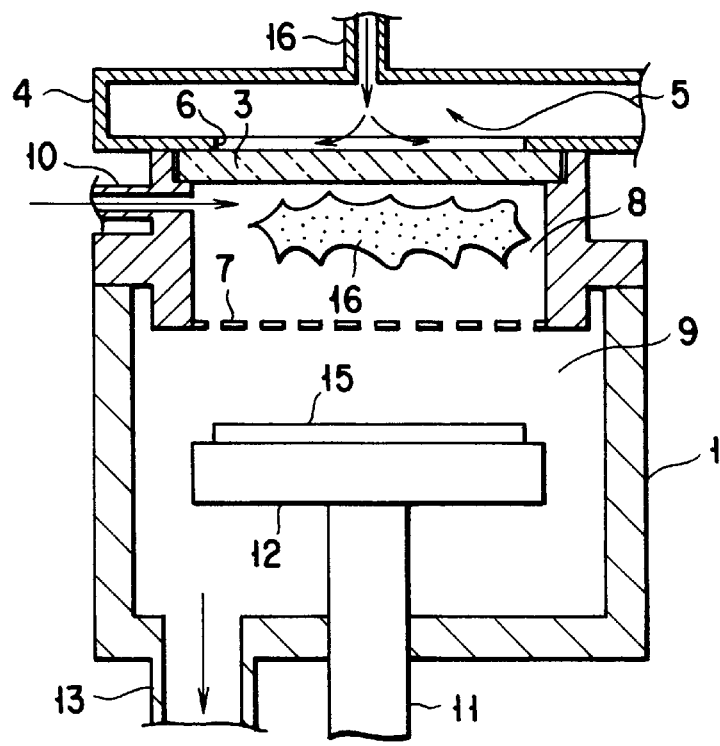
FIG. 35 is a view showing the processing apparatus provided within air supply tube.

FIG. 30 is a view of an outer appearance of the slot antennas 192 and 193 viewed from above. FIG. 31 is a view of an outer appearance of the slot antennas 192 and 193 viewed from below.

Those edge sides of the slot antennas 192 and 193 which are not in contact with both wall sides of the microwave guide 191 are slanted, respectively, thereby forming tapered portions 194 and 195.

The tapered portions 194 and 195 are formed such that the thickness of the bottom surface of the microwave guide 191 from the microwave guide 191 toward the dielectric window 190.

Specifically, the opening areas of the slot antennas 192 and 193 are formed so as to increase from the microwave guide 191 toward the dielectric window 190.

By thus forming the tapered portions 194 and 195 on the slot antennas 192 and 193, respectively, plasma processing can be performed with use of a microwave involving less turbulence at the slot antennas of the microwave guide 191 or a resonator. Specifically, stable plasma processing can be performed within a wide microwave output range and a wide pressure range.

The advantages as described above can be obtained by plasma processing apparatuses according to the above fifth to twelfth embodiments.

Note that the present invention is not limited to the first to thirteenth embodiments described above, but may be modified variously. For example, as shown in FIG. 32, a path 196 may be made in a rectangular top plate 23, so that a cooling gas or liquid may flow through the path 196. As viewed from the front, the top plate looks as shown FIG. 33. The top plate 23 may have a tapered portion 194 as shown in FIG. 30 or a tapered portion 195 as shown in FIG. 31. The slot antenna 192 and 193 may become thicker due to the path 196 made in the top plate 32, but the path 196 helps to concentrate an electric field, stabilizing the plasma. As a result, a successful plasma processing can be accomplished.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A plasma processing apparatus comprising:
   a microwave guide for guiding a microwave;
   an airtight chamber for containing an object to be processed;
   gas-introducing means for introducing a reaction gas into the airtight chamber;
   a dielectric window provided between the microwave guide and the airtight chamber and closing the airtight chamber;
   a top plate contained in a part of the microwave guide and arranged, forming a gap jointly with the dielectric window;
   an cooling means provided on the top plate, for cooling at least the dielectric window,
   wherein the reaction gas is supplied into the airtight chamber while the microwave is being guided into the airtight chamber, thereby to generate a plasma and process the object.

2. A plasma processing apparatus according to claim 1, wherein the cooling means introduces a cooling gas between the dielectric window and the top plate.

3. A plasma processing apparatus according to claim 1 or 2, wherein the cooling means has a meandering partition member located between the dielectric window and the top plate, defining a band-shaped path for allowing passage of a cooling gas.

4. A plasma processing apparatus according to claim 1 or 2, wherein the cooling means has a spiral partition member located between the dielectric window and the top plate, defining a spiral path for allowing passage of a cooling gas.

5. A plasma processing apparatus according to claim 4, wherein the cooling means comprises a plurality of gas guiding portions for guiding the cooling gas from an outer rim of the dielectric window and the spiral path extending from the outer rim of the dielectric window and communicating with the gas guiding portions.

6. A plasma processing apparatus according to claim 4, wherein at least one of a decompression portion for decompressing the cooling gas and a temperature control portion for controlling a temperature of the cooling gas is provided on the spiral.

7. A plasma processing apparatus according to claim 1, further comprising cooling liquid path provided in the top plate, for guiding a cooling liquid to cool the top plate.

8. A plasma processing apparatus according to claim 1, further comprising:
   a pair of slot antennas provided near both wall of the microwave guide;
   a space provided between the pair of slot antennas in the top plate;
   a cooling gas path having an end communicating with the space and another end connected to a gas introducing port for supplying a cooling gas; and
   a plurality of cooling gas guiding holes formed in the top plate, for guiding the cooling gas from the space and between the top plate and the dielectric window.

9. A plasma processing apparatus according to claim 8, wherein the cooling gas introducing holes are arranged more densely at a center portion of the top plate than at any other portion thereof.

10. A plasma processing apparatus according to claim 8, further comprising a cooling liquid path provided in the space, for guiding a cooling liquid.

11. A plasma processing apparatus according to claim 1, further comprising:
    a flow path provided in the top plate, for allowing passage of a cooling gas or a cooling; and
    a sheet provided between the top plate and the dielectric window, having a higher thermal conductivity than air, and being heat-resistant.

12. A plasma processing apparatus comprising:
    a microwave guide for guiding a microwave;
    an airtight chamber for containing a reaction gas:
    gas-introducing means for introducing a reaction gas into the airtight chamber;
    a slot antenna contained in a part of the microwave guide, for guiding the microwave through the microwave guide into the airtight chamber,
    wherein the slot antenna has a plurality of slots and comprises a first metal plate and a second metal plate which are connected together, the first metal plate comprises a connector strip and a plurality of parallel strips connected at one end by the connector strip and spaced apart at predetermined intervals and defining the width of the slots; and the second metal plate comprises a plurality of L-shaped strips, each fitted between adjacent two of the parallel strips, allowing the parallel strips to slide, and defining a slot having a predetermined length and a predetermined width equal to said predetermined interval.

13. A plasma processing apparatus according to claim 12, further comprising a plunger provided between the microwave guide and the slot antenna and comprising a body and a leaf spring mounted on the body,
    wherein the first metal plate and the second metal plate are electrically connected to an end of the microwave guide by the plunger, and at least one parallel strip of the first metal plate is arranged to slide with respect to the plunger.

14. A plasma processing apparatus according to claim 12, wherein the first metal plate has an elliptical screw hole having a major axis extending in a lengthwise direction of the first metal plate.

15. A plasma processing apparatus comprising:
    a microwave guide for guiding a microwave;
    a slot antenna provided in a part of the microwave guide, for radiating a microwave traveling through the microwave guide;
    an airtight chamber in which a plasma is generated from a reaction gas by applying the microwave from the slot antenna to the reaction gas, and reaction species generated by the plasma are used to process an object;

a microwave guide window provided between the microwave guide and the airtight chamber and closing the airtight chamber;

a reinforcement member provided outside the airtight chamber; and a beam structure connected to the reinforcement member and supporting the microwave guide window in the airtight chamber.

16. A plasma processing apparatus according to claim 15, wherein the reinforcement member is made of material having a longitudinal elasticity coefficient of $8.0 \times 10^3$ kg/mm$^2$.

17. A plasma processing apparatus according to claim 15, wherein the reinforcement member is made of stainless steel or iron.

18. A plasma processing apparatus according to claim 15, wherein the beam structure satisfies a relation of $d/t \geqq 10$, where d is the distance between slot antennas and t is the thickness which the beam structure has in the direction of introducing the microwave into the airtight chamber.

19. A plasma processing apparatus according to claim 15, wherein the beam structure satisfies a relation of $d/g \geqq 3$, where d is the distance between slot antennas and g is the width which the beam structure has in the direction the pitch d is measured.

20. A plasma processing apparatus according to claim 15, wherein the beam structure satisfies a relation of $f/t \geqq 3$, where f is the distance through which the microwave guide is guided and t is the thickness which the beam structure has in the direction of introducing the microwave into the airtight chamber.

21. A plasma processing apparatus according to claim 7, 8, 12 or 15, wherein the slot antenna has a tapered edge.

22. A plasma processing method for use in a plasma processing apparatus which comprises a microwave guide for guiding a microwave, an airtight chamber in which an object is placed, a top plate constituting a part of the microwave guide, and having a microwave guide port, a dielectric window provided between the microwave guide and the airtight chamber, and sealing the airtight chamber, and in which a reaction gas is supplied into the airtight chamber, the microwave is introduced from the microwave guide port into the airtight chamber through the dielectric window, thereby generating plasma, and processing the object, the plasma processing method comprising a step of cooling the dielectric window.

23. A plasma processing method according to claim 24, wherein in the cooling step, a cooling gas is introduced between the top plate and the dielectric window.

24. A plasma processing method according to claim 24, wherein in the cooling step, a sheet which has a higher thermal conductivity than air and is heat-resistant is provided between the top plate and the dielectric window, and one of a cooling gas and a cooling liquid is made to flow in a flow path formed in the top plate.

25. A plasma processing apparatus comprising:

a microwave guide for guiding a microwave;

an airtight chamber sealed and containing a reaction gas;

slot antennas for introducing the microwave guided through the microwave guide into the airtight chamber, the slot antennas being formed of a metal plate having a plurality of opening portions and a band member slidably provided between the opening portions, the opening portions being formed substantially parallel to a plane perpendicular to an electric field of the microwave, the opening portions each having a predetermined width, and being spaced apart from each other at a predetermined distance; and a plunger provided between the microwave guide and the band member, the plunger electrically connecting the microwave guide and the band member, and slidably contacting the band member.

* * * * *